(12) United States Patent
Silva et al.

(10) Patent No.: US 7,545,303 B1
(45) Date of Patent: Jun. 9, 2009

(54) SIGMA-DELTA DIFFERENCE-OF-SQUARES RMS-TO-DC CONVERTER WITH FORWARD AND FEEDBACK PATHS SIGNAL SQUARING

(75) Inventors: Paulo Gustavo Raymundo Silva, Delft (NL); Michael Hendrikus Laurentius Kouwenhoven, Zoetermeer (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/048,610

(22) Filed: Mar. 14, 2008

(51) Int. Cl.
*H03M 3/00* (2006.01)
(52) U.S. Cl. ...................................... 341/143; 341/155
(58) Field of Classification Search ................. 341/143, 341/155
See application file for complete search history.

(56) References Cited

U.S. PATENT DOCUMENTS

| | | | |
|---|---|---|---|
| 6,172,549 | B1 | 1/2001 | Gilbert |
| 6,204,719 | B1 | 3/2001 | Gilbert |
| 6,359,576 | B1 * | 3/2002 | Petrofsky ................... 341/143 |
| 6,549,057 | B1 | 4/2003 | Gilbert |
| 7,002,394 | B1 | 2/2006 | Gilbert |
| 7,106,604 | B2 * | 9/2006 | Nash ........................... 363/39 |
| 7,197,292 | B1 | 3/2007 | Kouwenhoven et al. |
| 2007/0270116 | A1 | 11/2007 | Kouwenhoven |

OTHER PUBLICATIONS

Candy, James, "A Use of Limit Cycle Oscillations to Obtain Robust Analog-to-Digital Converters", IEEE Transactions on Communications, vol. Com-22, No. 3, Mar. 1974, pp. 298-305.
Gilbert, B., "Novel Technique for R.M.S.-D.C. Conversion Based on the Difference of Squares", Electronic Letters, vol. 11, No. 8, Apr. 17, 1975, pp. 181-182.
Kouwenhoven, M., et al., "A 2GHz Mean-Square Power Detector with Integrated Offset Chopper", IEEE International Solid-State Circuits Conf., Feb. 2005, pp. 124-125; and 588.
Candy, James, et al., "Delta-Sigma Data Converters, Theory, Design and Simulation", IEEE Circuits & Systems Society, 1992, pp. 1-35.
Van De Plassche, Rudy, "CMOS Integrated Analog-to-Digital and Digital-to-Analog Converters", Kluwer Intl. Series in Engineering, 2003, pp. 1-33; 56-75; 416-435.
U.S. Appl. No. 12/048,578, filed Mar. 14, 2008, entitled Sigma-Delta Difference-of-Squares RMS-to-DC Converter With Forward Path Multiplier, Silva et al.

* cited by examiner

*Primary Examiner*—Khai M Nguyen
(74) *Attorney, Agent, or Firm*—Vedder Price P.C.

(57) ABSTRACT

A sigma-delta difference-of-squares RMS-to-DC converter and method for performing such a conversion in which a square of an analog feedback signal is combined differentially with a square of an analog input signal, thereby producing an analog product signal that includes at least one signal component corresponding to a difference between such signal squares. This analog product signal is filtered and digitized to produce a digital output signal to be available for use downstream in or with the host system, with such digital output signal also being converted to the analog feedback signal.

9 Claims, 21 Drawing Sheets

SIGMA-DELTA DIFFERENCE-OF-SQUARES RMS-TO-DC CONVERTER WITH FORWARD AND FEEDBACK PATHS SIGNAL SQUARING

BACKGROUND

1. Field of the Invention

The present invention relates to sigma-delta modulators, and in particular, to sigma-delta modulators used for converting root-mean-square (RMS) signal values to direct current (DC) signals.

2. Related Art

The Sigma-Delta ($\Sigma\Delta$) modulator is an electronic system that generates a digital output at very high resolution within a narrow bandwidth. The analog input is oversampled at a sampling rate ($f_S$) much larger than the required Nyquist rate ($f_N$), and it is coded as a bitstream with reduced number of (M) bits. As illustrated by FIG. 1, it contains a lowpass loop filter (LPF) and a coarse M-bit analog-to-digital converter (ADC) in the feedforward path (quantizer), and a digital-to-analog converter (DAC) in the feedback path. In order to produce a Nyquist rate output, the modulator is generally followed by a digital decimator. The decimator also filters the high-frequency noise and increases the length of the output digital word. The combination of a $\Sigma\Delta$ modulator with a digital decimation filter is named $\Sigma\Delta$ ADC. It is used in a large range of applications that require high resolution in a limited bandwidth, such as sensor interfaces, digital telecommunication receivers, precision applications and dc measurements.

The principle of operation of a $\Sigma\Delta$ modulator is better understood with the aid of a linearized model, depicted in FIG. 2. In this Laplace-domain model, L(s) is the loop filter transfer function and the feedback factor b express the ratio between ADC and DAC reference voltages. The analog-to-digital conversion of the loop filter output U(s) is modeled as an addition of quantization error Q(s). When a multi-bit quantizer is employed, the quantization error can be assumed to be a white noise source with a flat power spectrum density (PSD). The total quantization noise power ($q_{RMS}^2$) is independent of $f_S$, and it is given by:

$$q_{RMS}^2 = \frac{\Delta^2}{12} = \frac{V_{REF}^2}{12 \cdot (2^M - 1)^2} \tag{1}$$

The modulator output Y(s) can be expressed as:

$$Y(s) = \frac{1}{1 + bL(s)} \cdot Q(s) + \frac{L(s)}{1 + bL(s)} \cdot X(s) \tag{2}$$

where the term multiplying Q(s) is the noise transfer function (NTF), and the term multiplying X(s) is the signal transfer function (STF). When L(s) is a lowpass transfer function with very high DC gain, the STF is lowpass transfer function with 1/b gain at low frequencies, while the NTF is a highpass transfer function. FIG. 5 shows the typical digital output spectrum of a $\Sigma\Delta$ modulator when the analog input X(s) is a band-limited ($f_B = f_N/2$) low-frequency signal.

At low frequencies, the modulator output contains an undistorted replica of the analog input while the quantization noise is strongly attenuated. If the spectral content of the modulator output containing most of the shaped quantization noise power ($n_{RMS}^2$) is filtered out in the digital domain, very high resolution analog-to-digital conversion is achieved. The shaped quantization noise power after digital filtering is given by:

$$n_{RMS}^2 = \frac{q_{RMS}^2}{f_S} \cdot \int_{-f_B}^{f_B} \left| \frac{1}{1 + bL(2\pi f)} \right|^2 df \tag{3}$$

The noise shaping of the quantization errors and the digital filtering of the out-of-band noise are possible because $f_S > f_N = 2f_B$, i.e., the analog input is oversampled. The oversampling ratio (OSR) is defined as:

$$OSR = f_S/2f_B \tag{4}$$

The simplest implementation of a $\Sigma\Delta$ modulator is achieved when the loop filter is a single integrator and a comparator is used as quantizer (FIG. 4). In this case, it is named single-bit first-order $\Sigma\Delta$ modulator and the digital output is a bitstream.

A multi-bit $\Sigma\Delta$ modulator is implemented if a multi-bit ADC is used as quantizer, and a multi-bit DAC is employed in the feedback path. High-order noise shaping is achieved when the loop filter contains two or more integrators. The loop filter of a bandpass $\Sigma\Delta$ modulator contains high-frequency resonator stages instead of integrators. The in-band shaped quantization noise power of an M-bit $\Sigma\Delta$ modulator implemented with a cascade of P integrators is generically expressed by:

$$n_{RMS}^2 = \frac{V_{REF}^2}{12 \cdot (2^M - 1)^2} \cdot \frac{\pi^{2P}}{(2P+1) \cdot OSR^{2P+1}} \tag{5}$$

RMS-to-DC converters are electronic circuits that generate a DC output signal (either current or voltage), proportional to the Root-Mean-Square value (the square-root of the power) of the input signal. Such devices are used in a variety of applications, such as test and measurement, and communications, were a measure of the signal strength is important. A specific property of RMS-to-DC converters is that their response is insensitive to the precise shape of the input signal; i.e., it is insensitive to crest factor variations. This especially important in applications were the converter input signals can attain multiple different formats (modulation parameters, variable coding, etc. . . . ).

FIG. 5 depicts a RMS-to-DC converter based on the "difference-of-squares" technique implemented with a forward path multiplier. In this configuration, a linear analog multiplier is used to generate the difference of the square of the input signal and the square of the output signal, i.e., $K_m(\beta_x^2 x^2 - \beta_y^2 y^2)$. This is achieved by supplying one multiplier input with the sum of the input signal and the output signal, and the other input with the difference of these signals. The resulting difference-of-squares is then integrated, producing in the steady-state situation a DC level proportional to the true RMS value of the input signal. The integrator acts as a lowpass filter followed by an amplifier with high gain A. The lowpass filter removes the harmonics of the squared input signal, while the high gain forces the multiplier output to be zero. The relation between the converter DC output y and the RF input signal x(t) can be calculated based on the analysis of block diagram shown in FIG. 5:

$$y = AK_m[\beta_x^2 \overline{x(t)^2} - \beta_y^2 y^2] \tag{6}$$

where $K_m$ is the multiplier conversion gain. The static transfer function of the difference-of-squares RMS-to-DC converter is obtained by solving (6):

$$y = \frac{-1}{2AK_m\beta_y^2} + \sqrt{\frac{1}{(2AK_m\beta_y^2)^2} + \frac{\beta_x^2}{\beta_y^2} \cdot \overline{x(t)^2}} \quad (7)$$

When the dc gain A of the integrator approaches infinity, then the output signal y becomes proportional to the RMS value of the input signal x(t):

$$\lim_{A \to \infty} y = \frac{\beta_x}{\beta_y} \cdot \sqrt{\overline{x(t)^2}} \quad (8)$$

At the frequencies where the feedforward gain $AK_m$ is very high, the difference-of-squares RMS-to-DC converter static transfer is independent of the multiplier conversion gain and only determined by the scaling factors $\beta_x$ and $\beta_y$.

A RMS-to-DC converter based on the difference-of-squares principle can also be implemented using two matched squaring circuits as described in FIG. 5A. In this case, the relation between the converter DC output y and the RF input signal x(t) can be expressed as:

$$\lim_{A \to \infty} y = \sqrt{\frac{K_x}{K_y} \cdot \overline{x(t)^2}} \quad (8A)$$

where $K_x$ and $K_y$ are the gains of the squaring cells.

SUMMARY

In accordance with the presently claimed invention, a sigma-delta difference-to-squares RMS-to-DC converter and method for performing such a conversion are provided in which a square of an analog feedback signal is combined differentially with a square of an analog input signal, thereby producing an analog product signal that includes at least one signal component corresponding to a difference between such signal squares. This analog product signal is filtered and digitized to produce a digital output signal to be available for use downstream in or with the host system, with such digital output signal also being converted to the analog feedback signal.

In accordance with one embodiment of the presently claimed invention, a sigma-delta difference-of-squares RMS-to-DC converter includes:

analog signal multiplication and combining circuitry responsive to an analog input signal and at least one analog feedback signal by providing a resultant analog signal including at least one signal component corresponding to a difference between a square of the analog input signal and a square of the analog feedback signal;

analog signal filter circuitry coupled to the analog signal multiplication and combining circuitry, and responsive to the resultant analog signal by providing a filtered analog signal;

analog-to-digital conversion (ADC) circuitry coupled to the analog signal filter circuitry and responsive to the filtered analog signal by providing a related digital output signal; and digital-to-analog conversion (DAC) circuitry coupled between the ADC circuitry and the analog signal multiplication and combining circuitry, and responsive to the digital output signal by providing the at least one analog feedback signal.

In accordance with another embodiment of the presently claimed invention, a sigma-delta difference-of-squares RMS-to-DC converter includes:

analog signal multiplier and combiner means for multiplying and combining an analog input signal and at least one analog feedback signal to provide a resultant analog signal including at least one signal component corresponding to a difference between a square of the analog input signal and a square of the analog feedback signal;

analog signal filter means for filtering the resultant analog signal to provide a filtered analog signal;

analog-to-digital converter (ADC) means for converting the filtered analog signal to a related digital output signal; and digital-to-analog converter (DAC) means for converting the digital output signal to the at least one analog feedback signal.

In accordance with still another embodiment of the presently claimed invention, a method for performing a sigma-delta difference-of-squares RMS-to-DC conversion includes:

multiplying and combining an analog input signal and at least one analog feedback signal to provide a resultant analog signal including at least one signal component corresponding to a difference between a square of the analog input signal and a square of the analog feedback signal;

filtering the resultant analog signal to provide a filtered analog signal;

converting the filtered analog signal to a related digital output signal; and converting the digital output signal to the at least one analog feedback signal.

DETAILED DESCRIPTION

Figure 1:
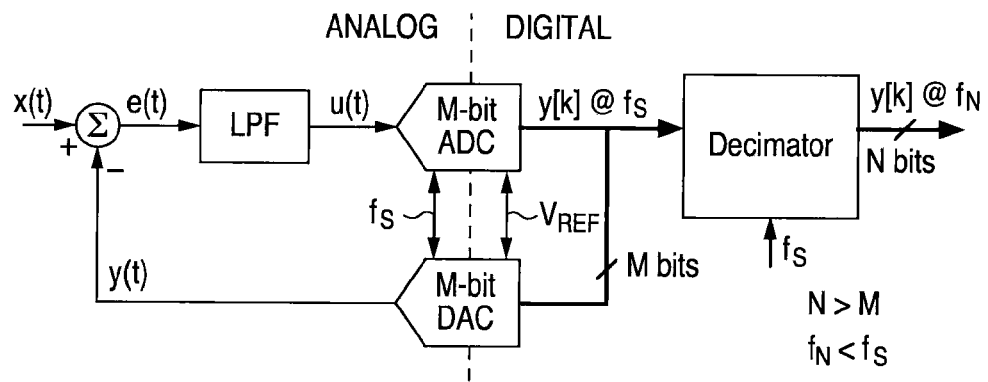
FIG. 1 illustrates a $\Sigma\Delta$ modulator and digital decimator.
Figure 2:
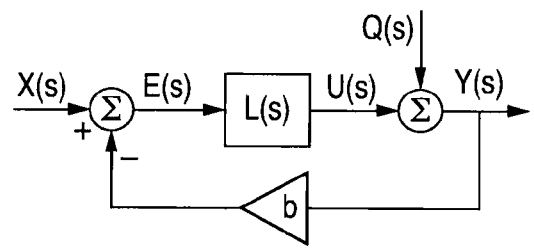
FIG. 2 illustrates a $\Sigma\Delta$ modulator linear model.
Figure 3:
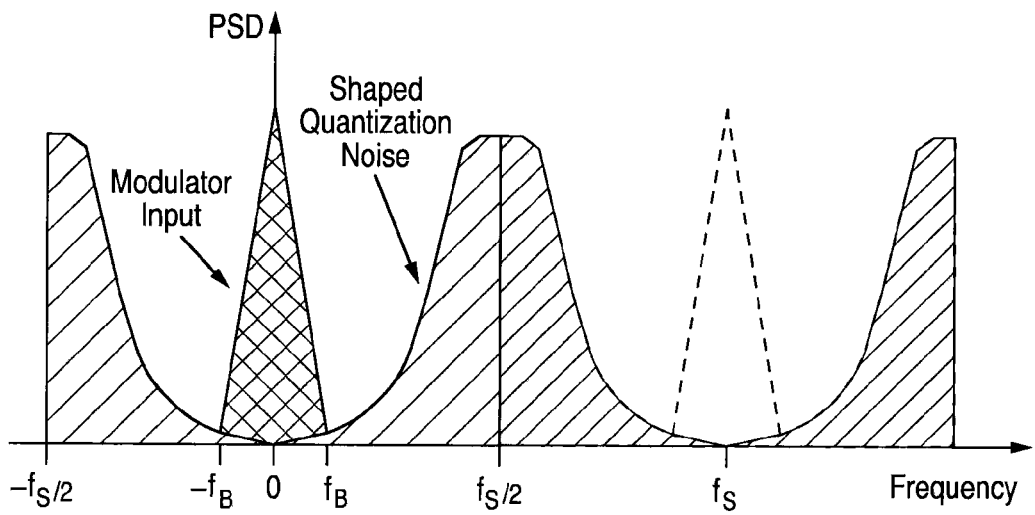
FIG. 3 illustrates a typical output spectrum of a $\Sigma\Delta$ modulator.
Figure 4:
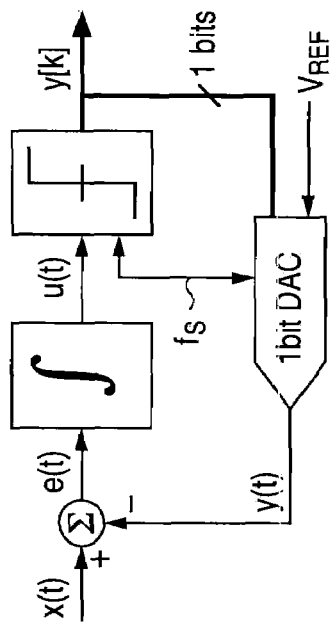
FIG. 4 illustrates a single-bit first-order $\Sigma\Delta$ modulator.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

The concept of ΣΔ difference-of-squares RMS-to-digital converter is introduced and defined in this invention disclosure. The claimed mixed-signal system for true RMS detection is the merge of the traditional ΣΔ modulator and the analog RMS-to-DC converter based on the difference-of-squares concept. Several architectures of ΣΔ difference-of-squares RMS-to-DC converters are described, including the possibilities of employing single or multi-bit internal quantization; feedback filtering to reduce the total quantization noise power; one or more loop filter integrators, feedforward and feedback paths for frequency compensation; and a lowpass or a bandpass loop filter. Chopper-stabilization, implemented through commutators running at two different frequencies, is employed to reduce the sensitivity to DC offsets and low-frequency errors, resulting in an extension of the useful dynamic range of the ΣΔ difference-of-squares RMS-to-digital converter. Further extension of the input-referred dynamic range can be obtained using the feedback DAC intrinsic variable-gain function. The claimed ΣΔ difference-of-squares RMS-to-DC converter architectures are based on the use of two squaring cells, or based on the feedback around a linear analog multiplier. The multiplier output is then integrated and quantized by a coarse ADC, as in the case of a ΣΔ modulator. The digital output is fed back to the multiplier in analog form, in such way that two feedback loops are established. The signal in the first multiplier input contains the addition of the input signal and the converter output, while the second multiplier input contains the subtraction of the input signal and the converter output. When two squaring cells are employed, the output of the forward squaring cell contains the input signal squared and the output of the feedback squaring cell contains the analog version of the output squared. The difference-of-squares is then integrated and quantized by a coarse ADC, as in the case of a regular ΣΔ modulator. The DAC in the feedback path provides an analog version of the digital output to the feedback squaring cell.

In both cases, the presence of sufficient loop gain forces the square of the output signal to be equal to the mean square of the input signal. In other words, the DC level of the converter digital output tracks the RMS level of the input signal minus the RMS level of the quantization errors. The invention realized based on the concepts here described, allows the implementation of ΣΔ difference-of-squares RMS-to-DC converters with a natural digital output, achieving very low-sensitivity to DC offsets and extended input-referred dynamic range.

Figure 7:
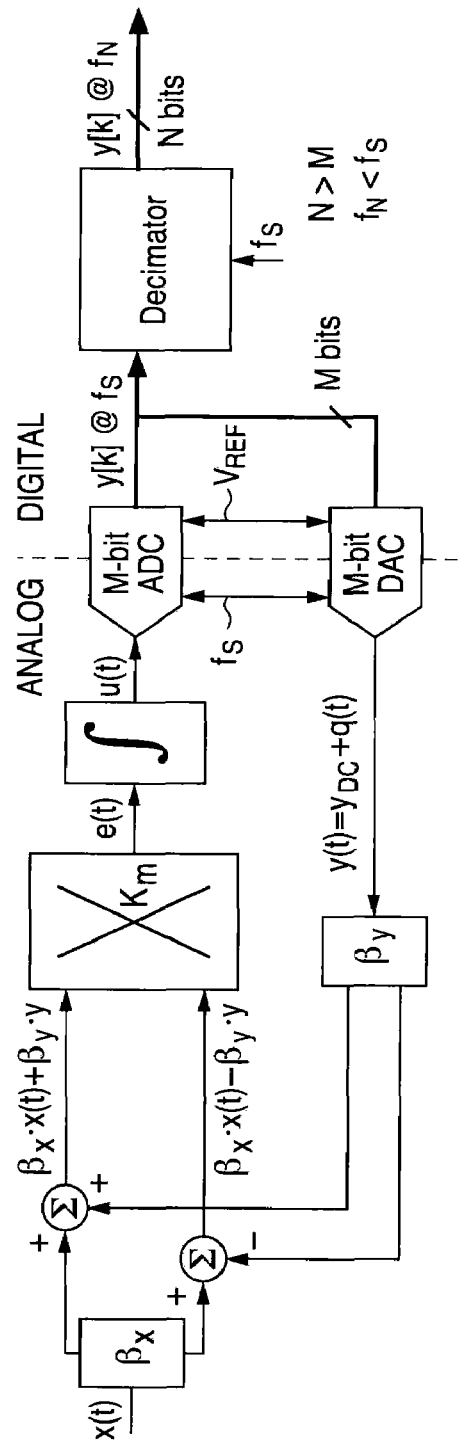
FIG. 7 illustrates a $\Sigma\Delta$ difference-of-squares RMS-to-DC converter with forward path multiplier and digital decimator.

The present invention comprises a new mixed-signal system for RMS-to-digital conversion, named ΣΔ difference-of-squares RMS-to-DC converter, depicted in FIG. 7 when forward path multiplication is employed. As discussed in more detail below, it also comprises all variations of this system employing multi-bit or single-bit quantization, first-order and high-order noise shaping, and lowpass or bandpass loop filter. This invention also covers the use of chopping stabilization to improve the sensitivity of the RMS-to-digital conversion, and a dynamic range extension technique based on the use of the feedback DAC to implement a variable-gain function.

Figure 6:
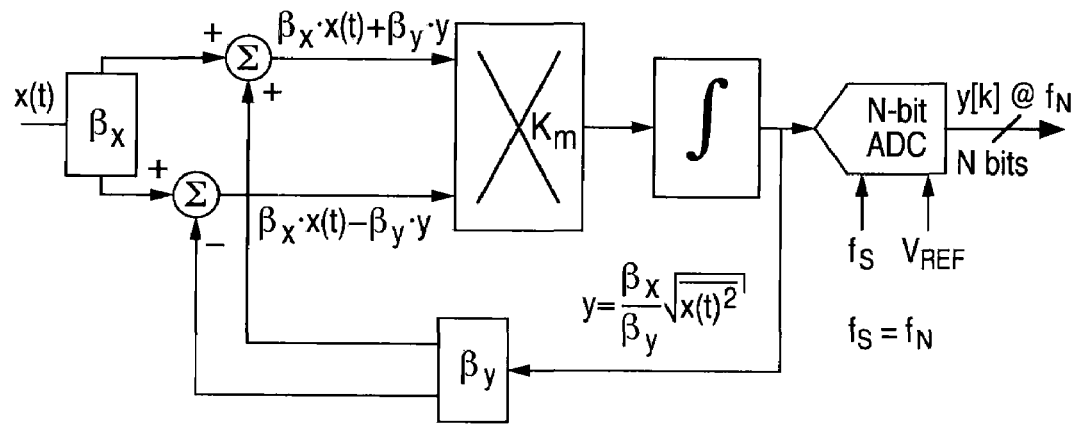
FIG. 6 illustrates a difference-of-squares RMS-to-DC converter with forward path multiplier followed by a high-resolution Nyquist ADC.
Figure 6A:
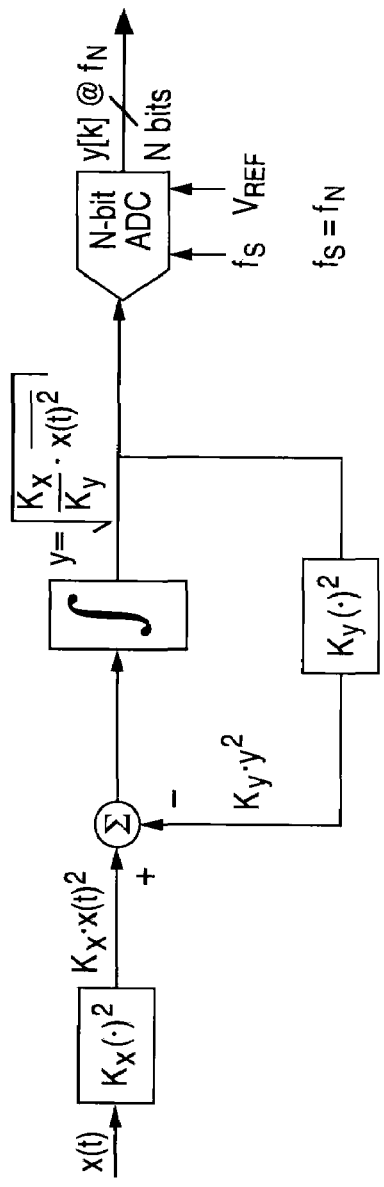
FIG. 6A illustrates a difference-of-squares RMS-to-DC converter with two squaring cells followed by a high-resolution Nyquist ADC.

Nowadays, most telecommunication and measurement systems are based on digital signal processors (DSPs). Therefore, wherever a RMS-to-DC converter is desirable to measure signal strength, it is most likely its analog output is digitized by an ADC before being digitally processed. FIG. 6 illustrates the use of a difference-of-squares RMS-to-DC converter employing forward path multiplication together with a Nyquist-rate ADC. FIG. 6A illustrates the use of a difference-of-squares RMS-to-DC converter employing two squaring cells together with the same Nyquist-rate ADC. Due to the low-frequency spectral content of the converter output, high sampling-rate Nyquist ADCs are generally not necessary. However, the power detection application requires very high DC resolution, and very low integral non-linearity (INL) and differential non-linearity (DNL).

The straight forward solution to implement a RMS-to-DC converter with digital output, i.e., a RMS-to-digital converter, is by integrating an analog RMS-to-DC converter together with a Nyquist-rate ADC. However, because the resolution and linearity of Nyquist-rate converters are determined by the matching accuracy of the analog building-blocks, such as capacitors, resistors or current sources, high resolution and linearity can only be achieved if expensive post-fabrication trimming techniques are employed. For example, an N-bit ADC based on resistive dividers require the relative mismatch among the resistors to be less than $2^{-N}$ to guarantee an INL below on-half of the least significant bit (LSB). Furthermore, the simple integration of the RMS detector with an ADC in a single chip does not bring any significant cost or performance advantage over the two-chip system-level solution.

Figure 5:
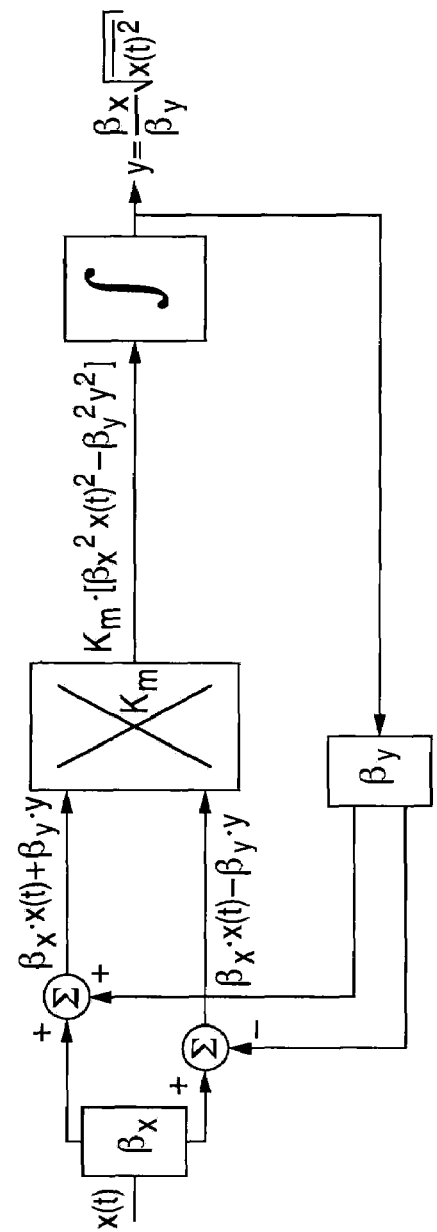
FIG. 5 illustrates a RMS-to-DC Conversion based on the difference-of-squares technique employing a forward path multiplier.
Figure 5A:
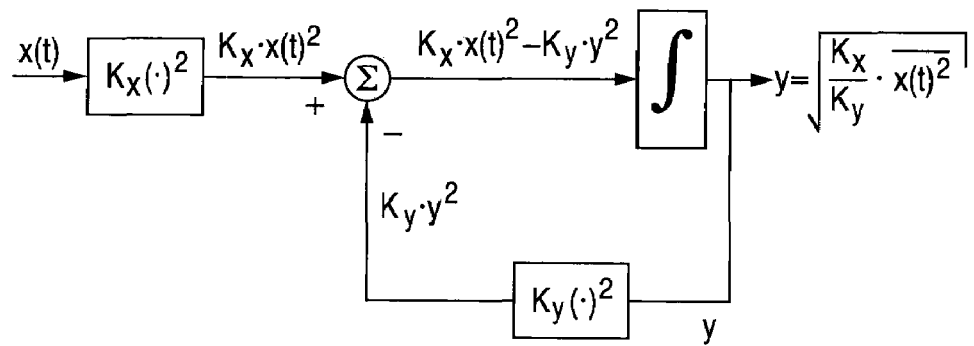
FIG. 5A illustrates a RMS-to-DC Conversion based on the difference-of-squares technique employing two squaring cells.

However, the low-frequency content of the RMS detector output is very suitable to be combined with oversampling techniques. Oversampled ADCs, like ΣΔ modulators, enable high-resolution and high-linearity analog-to-digital conversion without the need for extreme analog matching. This is possible because the oversampling enables a trade-off between timing accuracy and matching accuracy. The most compact oversampled RMS-to-digital converter, depicted in FIG. 7, is obtained when the traditional difference-of-squares analog system with forward multiplication (FIG. 5) is merged together with a ΣΔ modulator (FIG. 1). The new mixed-signal system with digital output is named ΣΔ difference-of-squares RMS-to-DC converter.

The operation of the ΣΔ difference-of-squares RMS-to-DC converter is described as follows. The analog multiplier generates the difference between the square of the input and the square of the output. The integrator filters out the high-frequency harmonics and forces multiplier output to be zero at low frequencies. The integrator output, whose DC level is proportional to the input signal RMS value, is oversampled and digitized by a coarse quantizer (M-bit ADC). The quantizer output y[k], containing a digital version of the input RMS level and quantization noise, is fed back to the input multiplier in analog form. The complete RMS-to-digital converter is obtained when the quantizer output is processed in the digital domain. The digital decimator filters-out the high-frequency quantization noise and reduces the sampling-rate, at the same time producing a digital N-bit word with the converter's full nominal resolution.

Figure 7A:
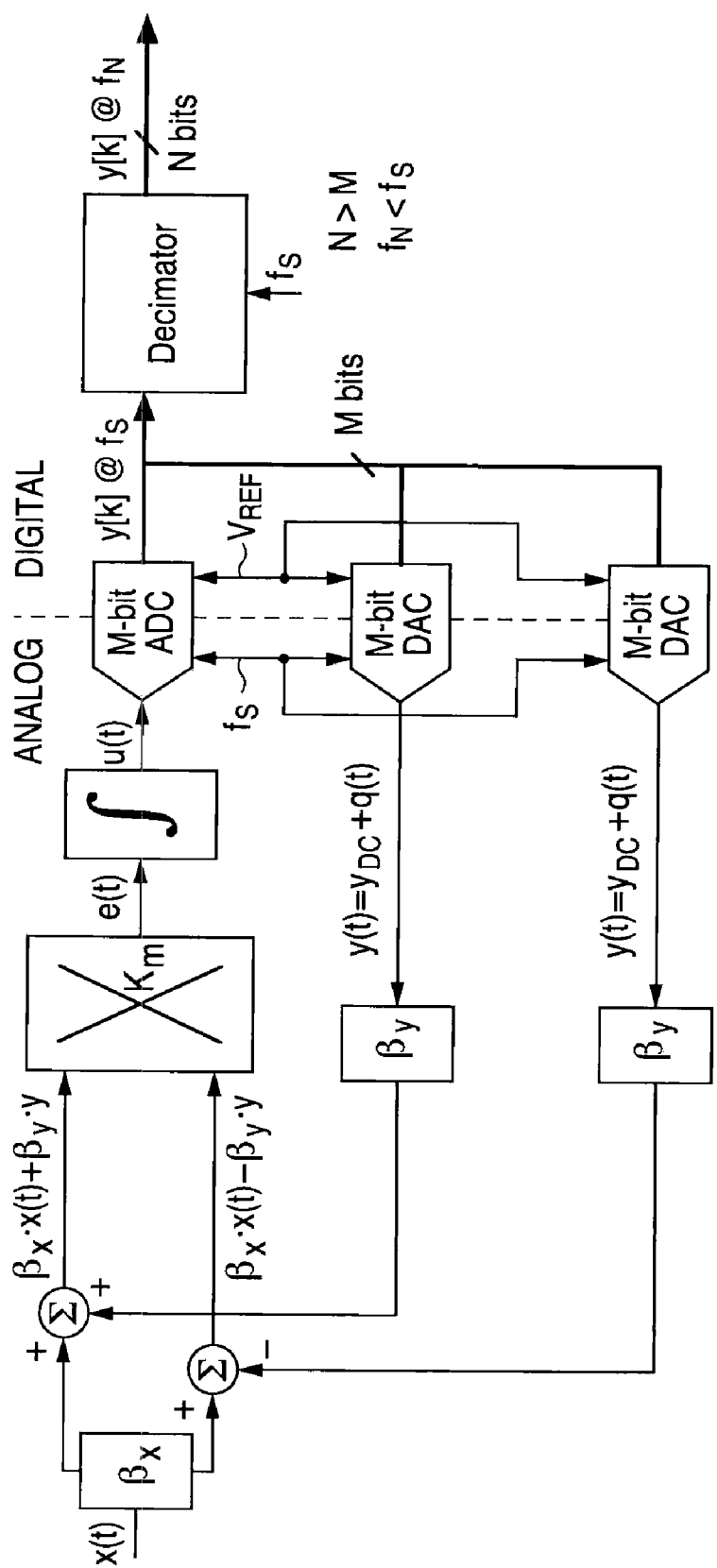
FIG. 7A illustrates a $\Sigma\Delta$ difference-of-squares RMS-to-DC converter with forward path multiplier, two feedback DACs and digital decimator.

Referring to FIG. 7A, an alternative embodiment of such a ΣΔ difference-of-squares RMS-to-DC converter uses dual feedback DACs instead of a signal router (e.g., signal divider) to produce the two analog feedback signals y(t). Operation of the remainder of the circuitry remains the same.

Figure 8:
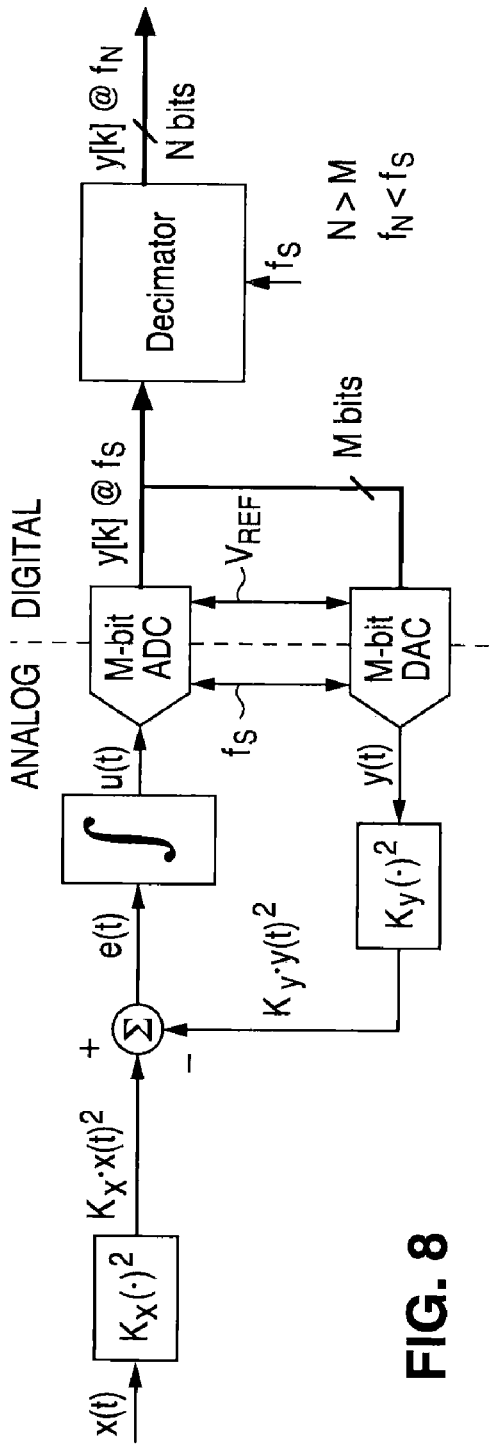
FIG. 8 illustrates a $\Sigma\Delta$ difference-of-squares RMS-to-DC converter using two squaring circuits and digital decimator.

In accordance with an alternative embodiment, the difference-of-squares front-end can be implemented with two squaring circuits, as depicted in FIG. 8. The operation of the remainder of the circuitry remains the same.

In the case of regular ΣΔ modulators (FIG. 1), the error signal e(t) contains the difference between the input and the output, while the case of difference-of-squares ΣΔ RMS-to-DC converters e(t) contains the difference of the squares (FIG. 8). The relation between the DC level $y_{DC}$ of the digital output y[k] and the analog input x(t) can be calculated:

$$y_{DC} = A[K_x \overline{x(t)^2} - K_y y_{DC}^2 - K_y \overline{q(t)^2}] \tag{9}$$

where q(t) is the quantization error added during the internal analog-to-digital conversion of the integrator output u(t). The large-signal static transfer of the ΣΔ difference-of-squares RMS-to-DC converter (FIG. 8) is obtained by solving (9):

$$y_{DC} = \frac{-1}{2AK_y} + \sqrt{\frac{1}{(2AK_y)^2} + \frac{K_x}{K_y}\overline{x(t)^2} - \overline{q(t)^2}} \tag{10}$$

When the DC-gain A of the integrator approaches infinity, $y_{DC}$ becomes proportional to the RMS level of the input minus the RMS level of the quantization error:

$$\lim_{A \to \infty} y_{DC} = \sqrt{\frac{K_x}{K_y}\overline{x(t)^2} - \overline{q(t)^2}} = \sqrt{\frac{K_x}{K_y}\overline{x(t)^2} - \frac{V_{REF}^2}{12 \cdot (2^M - 1)^2}} \tag{11}$$

For the embodiments described in FIGS. 7 and 7A, the relation between the DC level $y_{DC}$ of the digital output y[k] and the analog input x(t) becomes:

$$\lim_{A \to \infty} y_{DC} = \sqrt{\frac{\beta_x^2}{\beta_y^2}\overline{x(t)^2} - \overline{q(t)^2}} = \sqrt{\frac{\beta_x^2}{\beta_y^2}\overline{x(t)^2} \frac{V_{REF}^2}{12 \cdot (2^M - 1)^2}} \quad (11A)$$

Figure 9:
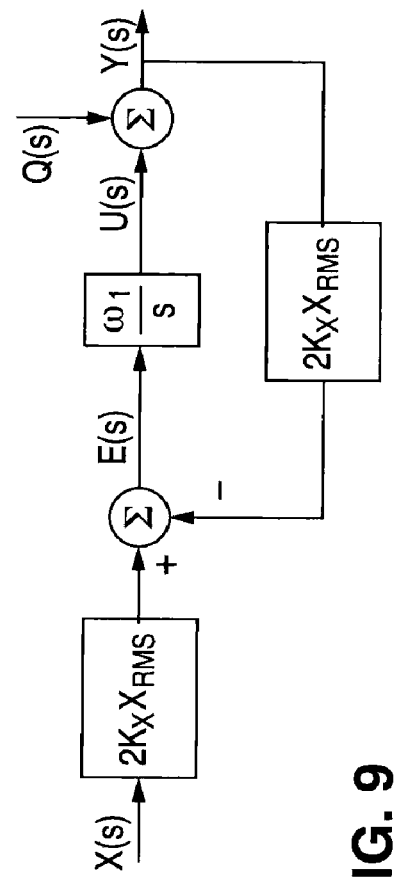
FIG. 9 illustrates a linearized small-signal model for a first-order $\Sigma\Delta$ difference-of-squares RMS-to-DC converter shown in FIG. 8.
Figure 9A:
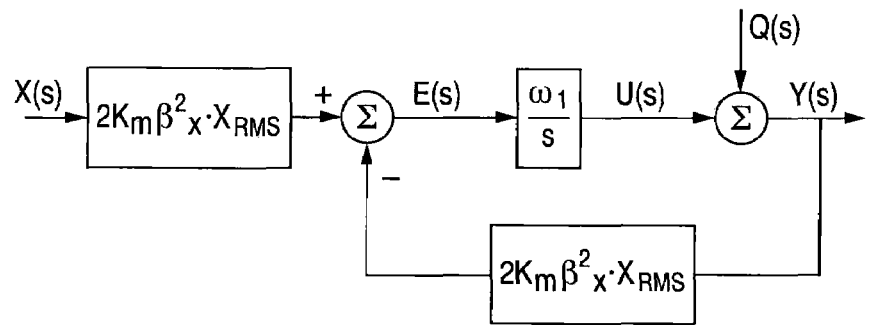
FIG. 9A illustrates a linearized small-signal model for a first-order $\Sigma\Delta$ difference-of-squares RMS-to-DC converters shown in FIGS. 7 and 7A.

The total quantization noise power, that is always a function of the resolution of the internal quantizer, becomes an important error source in ΣΔ RMS-to-DC converters. After the modulator internal states have reached a steady-state condition, it is possible to derive a linearized small-signal model for the ΣΔ difference-of-squares RMS-to-DC converter. In this situation, the squaring circuits can be replaced by an equivalent small-signal gain $2K_x X_{RMS}$ valid for each different steady-state solution $y_{DC} = X_{RMS}$. FIG. 9 shows the resulting linearized small-signal model in the Laplace-domain based on the embodiment described in FIG. 8. FIG. 9A shows the resulting linearized small-signal model in the Laplace-domain based on the embodiments described in FIGS. 7 and 7A. In this case, the implicit squaring operation is replaced by an equivalent small-signal gain $2K_m \beta_x^2 X_{RMS}$ valid for each different steady-state solution $y_{DC} = X_{RMS}$.

In FIGS. 9 and 9A, $\omega_1$ is the radian unity gain frequency of the loop filter integrator and Q(s) is the additive quantization noise source. Similar to the linear analysis of regular ΣΔ modulators, Y(s) can be expressed as a function of X(s) and Q(s):

$$Y(s) = \frac{s}{s + 2K_x X_{RMS}\omega_1} \cdot Q(s) + \frac{2K_x X_{RMS}\omega_1}{s + 2K_x X_{RMS}\omega_1} \cdot X(s) \quad (12)$$

Figure 10:
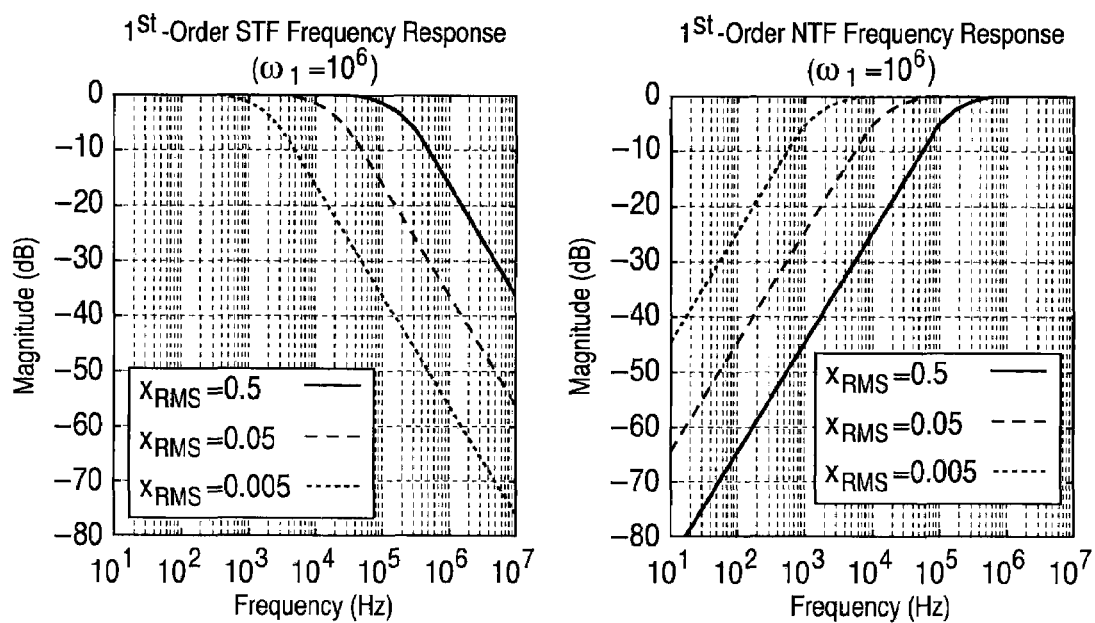
FIG. 10 illustrates small-signal STF and NTF frequency responses for a first-order ΣΔ difference-of-squares RMS-to-DC converter (for $K_x=K_y=1$ and $\omega_1=10^6$).

The term multiplying Q(s) is the small-signal NTF, and the term multiplying X(s) is the small-signal STF. In this case however, where the error signal is the difference-of-squares, the corner frequency of both NTF and STF is a function of the input RMS level $X_{RMS}$. FIG. 10 shows the STF and NTF magnitude frequency responses for several input power levels.

For the power measurement application, the corner frequency variation is irrelevant regarding the STF, as all information about the input RMS level appears at the digital output as a DC component. However, the NTF frequency response at low frequencies is strongly dependent on $X_{RMS}$. For an input RMS dynamic range of 40 dB, the in-band quantization noise attenuation is 40 dB smaller for lower power levels in comparison with the maximum input situation. The noise level at the output of the complete RMS-to-digital converter, obtained after digital filtering and decimation, depends on the NTF low-frequency attenuation and on the circuit thermal noise floor.

Figure 11:
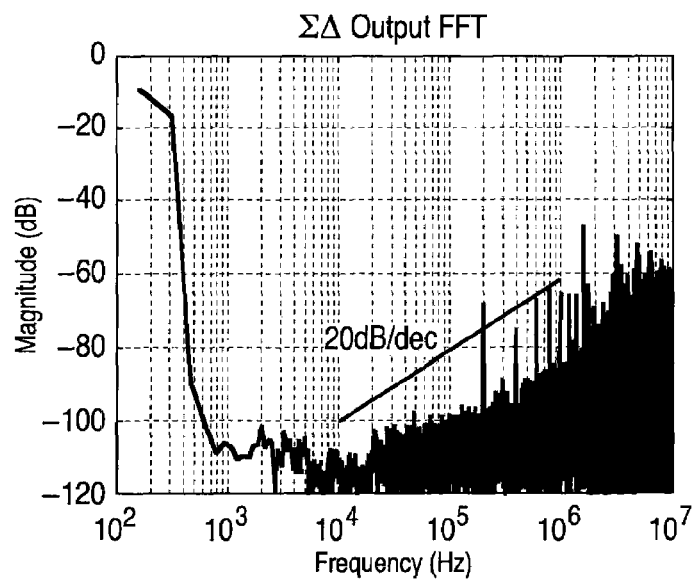
FIG. 11 illustrates an output spectrum of a first-order ΣΔ difference-of-squares RMS-to-DC converter employing four-bit internal quantization (for $V_{REF}=0.4V$), with a sinusoidal RF input (for $f_{1N}=120$ MHz).

FIG. 11 shows the output spectrum of a first-order ΣΔ difference-of-squares RMS-to-DC converter employing 4-bit internal quantization. The 131072-points digital output was obtained from a transient circuit simulation with a sampling frequency ($f_S$) of 20 MHz and sinusoidal input x(t)=0.2*cos (2π*120 MHz*t). The first-order noise shaping (20 dB/dec slope) can be recognized in FIG. 11. Because of the multi-bit quantization, the quantization noise PSD is quite small even nearby $f_S/2$. In accordance with the previous analysis, the DC level in the 4-bit digital output is proportional to the RMS level of the RF input signal minus the total quantization noise power. A high-resolution Nyquist-rate digital output can be obtained after the high-frequency quantization noise is filtered-out.

Figure 12:
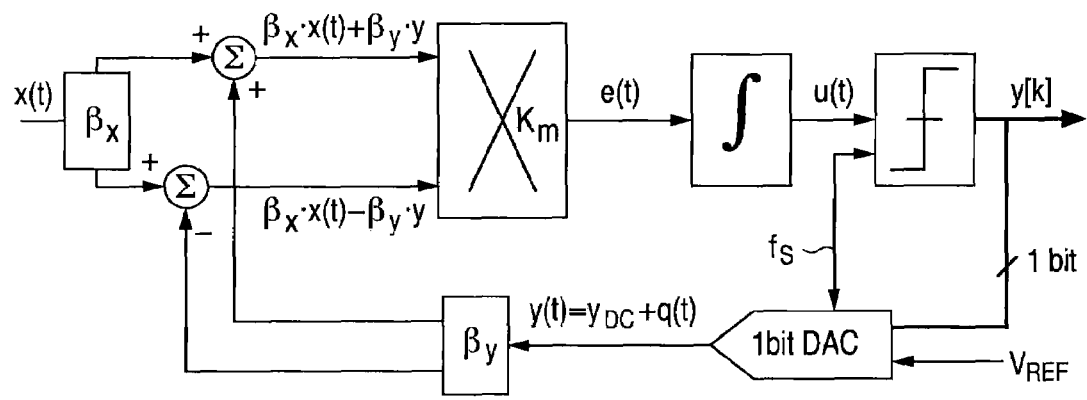
FIG. 12 illustrates a single-bit first-order ΣΔ difference-of-squares average-power-to-DC converter with forward path multiplier.
Figure 12A:
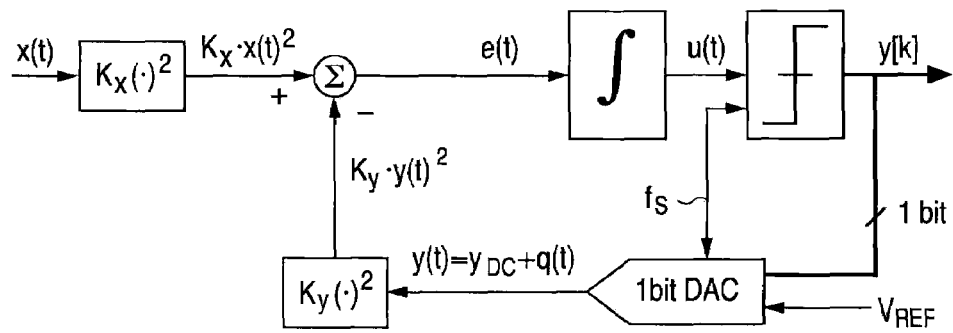
FIG. 12A illustrates a single-bit first-order ΣΔ difference-of-squares average-power-to DC converter with two squaring cells.

Compared to Nyquist-rate ADCs, the linearity obtained with ΣΔ ADCs is much less dependent on the matching of the internal analog building-blocks. The ultimate limitation to the linearity of a ΣΔ ADC, is the linearity of the feedback DAC. Therefore, the linearity of any ΣΔ modulator is maximal when single-bit quantizer (a simple comparator) and single-bit feedback DAC are employed. This happens because it is always possible to draw a perfect straight line between the two quantization levels of single-bit ADC or DAC. FIG. 12 depicts a single-bit first-order ΣΔ difference-of-squares modulator with forward path multiplier. FIG. 12A depicts a single-bit first-order ΣΔ difference-of-squares modulator with two squaring cells.

Another property of single-bit ADCs and DACs is the fact that the gain of these blocks cannot be defined. Unfortunately, this characteristic is incompatible to the squaring non-linearity always present in the front-end of a difference-of-squares RMS-to-DC converter. When a signal with two non-negative coarse levels, like the output of a single-bit DAC, is squared, the resulting waveform is a scaled version of the original signal. In the case of a symmetrical bitstream with a positive and a negative level, the singularity is even stronger: the squaring output only contains a DC voltage. As a result, the signal e(t) in FIGS. 12 and 12A does not contain the difference-of-squares, but $x(t)^2 - V_{REF}y(t)$ where only the input signal is squared. Based on FIG. 12, the relation between the DC level $y_{DC}$ of the digital output y[k] and the analog input x(t) can be calculated:

$$\lim_{A \to \infty} y_{DC} = \frac{\beta_x^2}{\beta_y^2} \cdot \frac{\overline{x(t)^2}}{V_{REF}} \quad (13)$$

Based on FIG. 12A, the relation between the DC level $y_{DC}$ of the digital output y[k] and the analog input x(t) can be once again calculated:

$$\lim_{A \to \infty} y_{DC} = \frac{K_x}{K_y} \cdot \frac{\overline{x(t)^2}}{V_{REF}} \quad (14)$$

Figure 13:
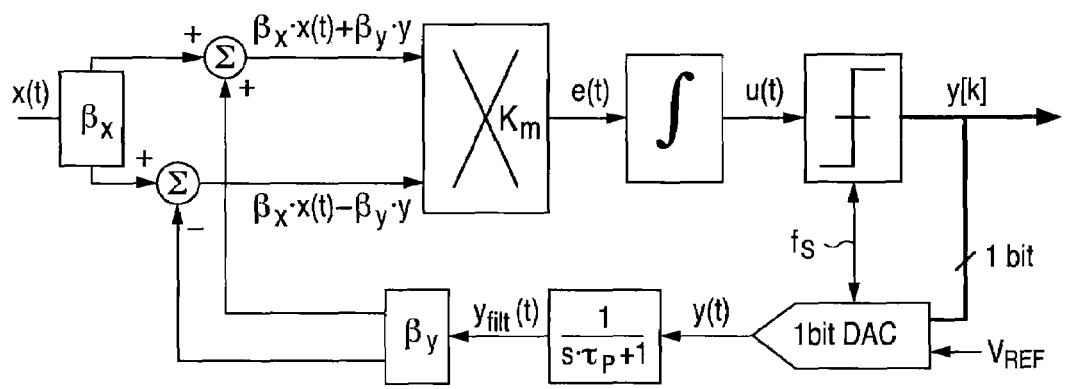
FIG. 13 illustrates a single-bit second-order ΣΔ difference-of-squares RMS-to-DC converter with forward path multiplier employing feedback filtering.
Figure 13A:
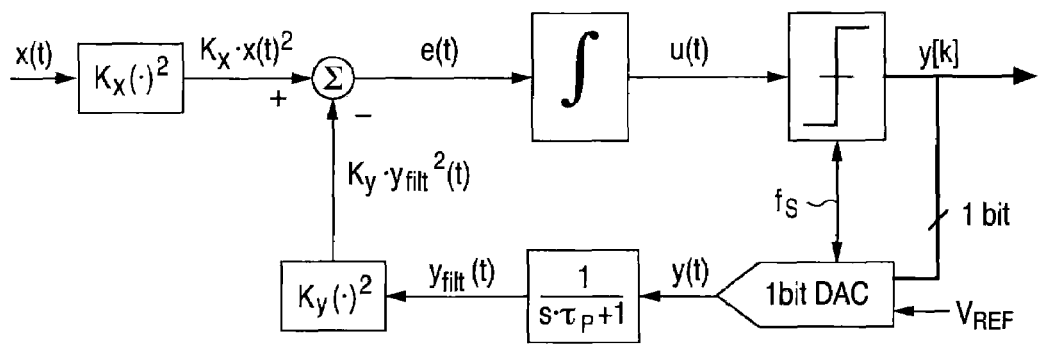
FIG. 13A illustrates a single-bit second-order ΣΔ difference-of-squares RMS-to-DC converter with two squaring cells employing feedback filtering.

The out of the single-bit first-order ΣΔ difference-of-squared modulator is proportional to the average input-signal power, instead of the input RMS level. Because the much larger dynamic range of the input average-power compared to the input RMS level, the "ΣΔ average-power-to-DC converter" is much more sensitive to DC errors when measuring small input signals. The strategy to circumvent this limitation and build a useful single-bit ΣΔ difference-of-squares RMS-to-DC converter, is to filter the output of the single-bit DAC. In this way, all the benefits of the highly-linear single-bit ADC and DAC are kept, while the filtered DAC output can attain several voltage levels. FIG. 13 depicts a single-bit ΣΔ difference-of-squares RMS-to-DC converter with forward path multiplication employing feedback filtering. FIG. 13A depicts a single-bit ΣΔ difference-of-squares RMS-to-DC converter with two squaring cells employing feedback filtering.

Figure 14:
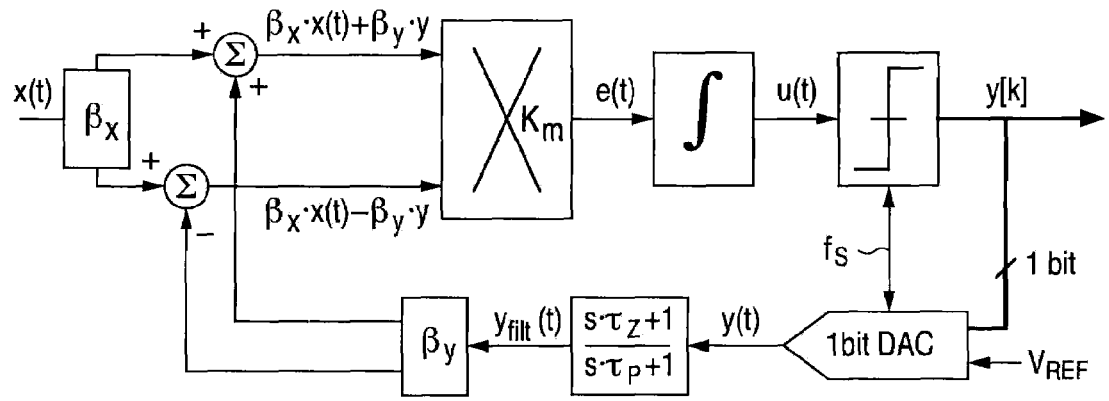
FIG. 14 illustrates a single-bit second-order ΣΔ difference-of-squares RMS-to-DC converter with forward path multiplier employing feedback pole-zero filtering for high-frequency compensation.
Figure 14A:
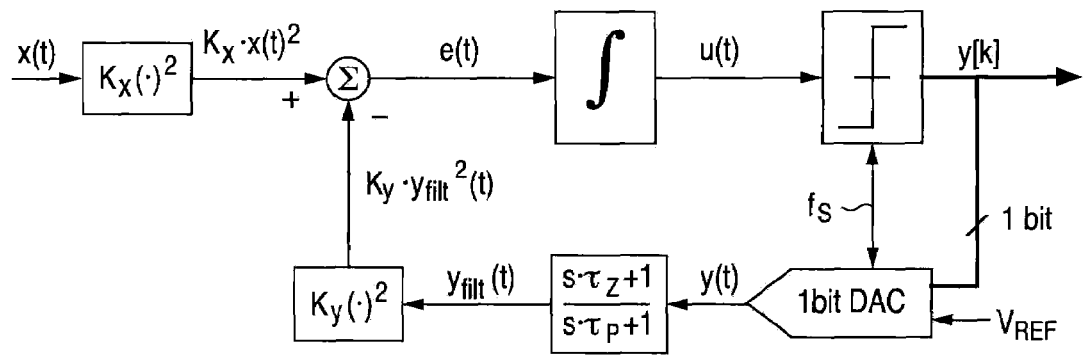
FIG. 14A illustrates a single-bit second-order ΣΔ difference-of-squares RMS-to-DC converter with two squaring cells employing feedback pole-zero filtering for high-frequency compensation.

Due to the feedback filter, the reconstructed output of the single-bit DAC resembles much more the output of a multi-bit DAC and can be successfully squared. In this architecture, because the multiplier output contains the difference-of-squares, the DC level of the modulator output is again proportional to the input RMS level. Furthermore, because the high-frequency quantization noise is filtered, the DC errors caused by the total quantization noise power are reduced. However, the single pole implemented by the feedback filter increases the effective loop filter order. As a result, the total loop filter feedback phase-shift becomes 180 deg and the resulting single-bit second-order ΣΔ RMS-to-DC converter becomes unstable. In order to restore the modulator stability and keep the feedback filtering, a high frequency compensation zero has to be added to the modulator feedback transfer function. FIG. 14 shows a stable single-bit second-order ΣΔ difference-of-squares RMS-to-DC converter with forward path multiplication employing feedback filtering and a zero for frequency compensation. FIG. 14A shows a stable single-bit second-order ΣΔ difference-of-squares RMS-to-DC converter with two squaring cells employing feedback filtering and a zero for frequency compensation.

As should be readily understood by one of ordinary skill in the art, the feedback filters of FIGS. 13, 13A, 14 and 14A can be implemented as continuous-time filters or, alternatively, as discrete-time analog filters, e.g., finite impulse response (FIR) filters. Further, if a multi-bit feedback DAC is used instead of the single bit DAC as shown, the feedback filters can be implemented as digital filters.

Figure 15:
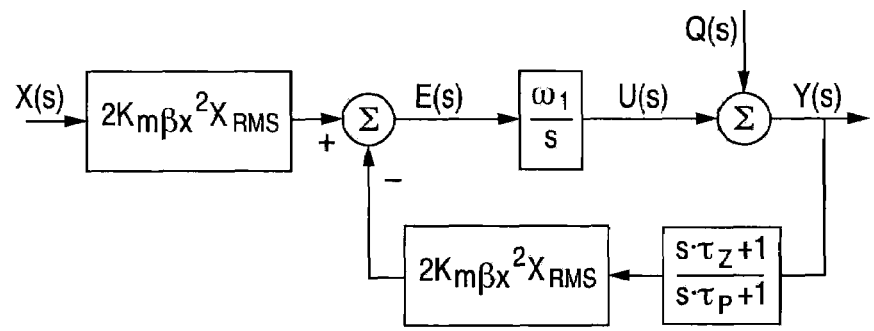
FIG. 15 illustrates a linearized small-signal model of the second-order ΣΔ difference-of-squares RMS-to-DC converter with feedback filtering and a zero for frequency compensation shown in FIG. 14A.

For every large-signal steady-state DC solution of a ΣΔ RMS-to-DC converter, it is possible to derive a linearized small-signal model as depicted in FIG. 15. In this block diagram, the second-order nature of the architecture shown in FIG. 14 is more evident. The small-signal stability of the modulator employing a feedback filter with high frequency zero compensation can be studied based on the second-order feedback loop filter $L_{fb}(s)$ frequency response:

$$L_{fb}(s) = -\frac{2K_m\beta_x^2 X_{RMS}\omega_1(s\tau_Z + 1)}{s(s\tau_p + 1)} \quad (14)$$

Figure 15A:
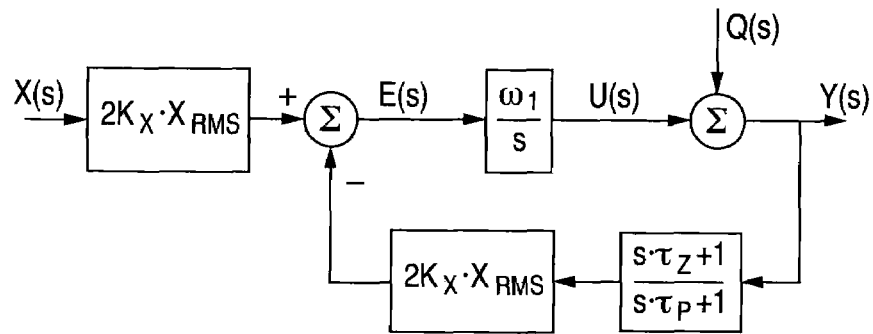
FIG. 15A illustrates a linearized small-signal model of the second-order ΣΔ difference-of-squares RMS-to-DC converter with feedback filtering and a zero for frequency compensation shown in FIG. 14A.

Another equivalent linearized small-signal model, as depicted in FIG. 15A, can be derived based on the embodiment shown in FIG. 14A. In this case, the second-order feedback loop filter $L_{fb}(s)$ frequency response can be expressed as:

$$L_{fb}(s) = -\frac{2K_x X_{RMS}\omega_1(s\tau_Z + 1)}{s(s\tau_p + 1)} \quad (14A)$$

Figure 16:
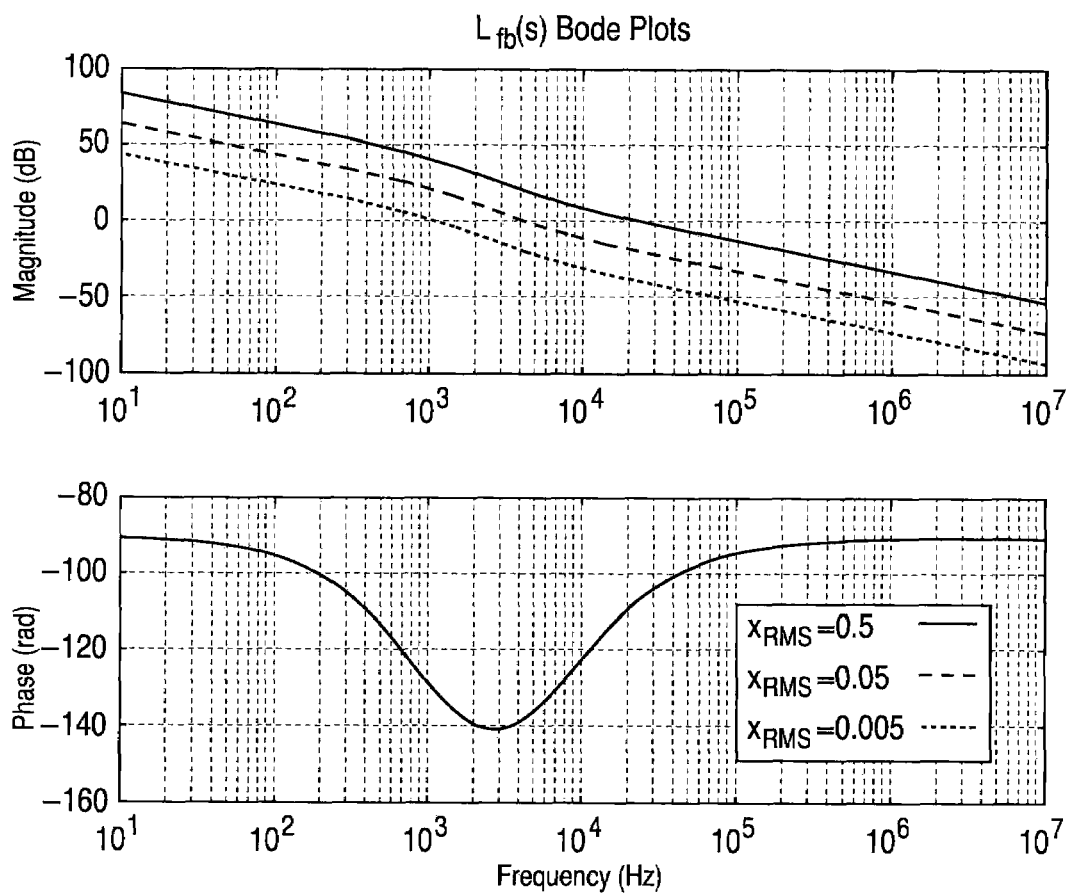
FIG. 16 illustrates Bode plots for a small-signal second-order loop filter with feedback zero compensation.

The Bode plots for $L_{fb}(s)$ are shown in FIG. 16. The loop filter presents a −40 dB/dec slope between the pole and zero frequencies. In order to implement a stable high-order single-bit ΣΔ modulator, the loop filter phase-shift around half the sampling frequency ($f_s/2$) should be as close as possible to −90 deg. This is possible in this architecture because of the zero implemented in the feedback path.

Based on the block diagram in FIG. 15, the small-signal STF and NTF can be calculated for this architecture:

$$STF(s) = \frac{2K_m\beta_x^2 X_{RMS}\omega_1(s\tau_p + 1)}{\tau_p s^2 + s(1 + 2K_m\beta_x^2 X_{RMS}\omega_1 \cdot \tau_Z) + 2K_m\beta_x^2 X_{RMS}\omega_1} \quad (15)$$

$$NTF(s) = \frac{s(s\tau_p + 1)}{\tau_p s^2 + s(1 + 2K_m\beta_x^2 X_{RMS}\omega_1 \cdot \tau_Z) + 2K_m\beta_x^2 X_{RMS}\omega_1} \quad (16)$$

Figure 17:
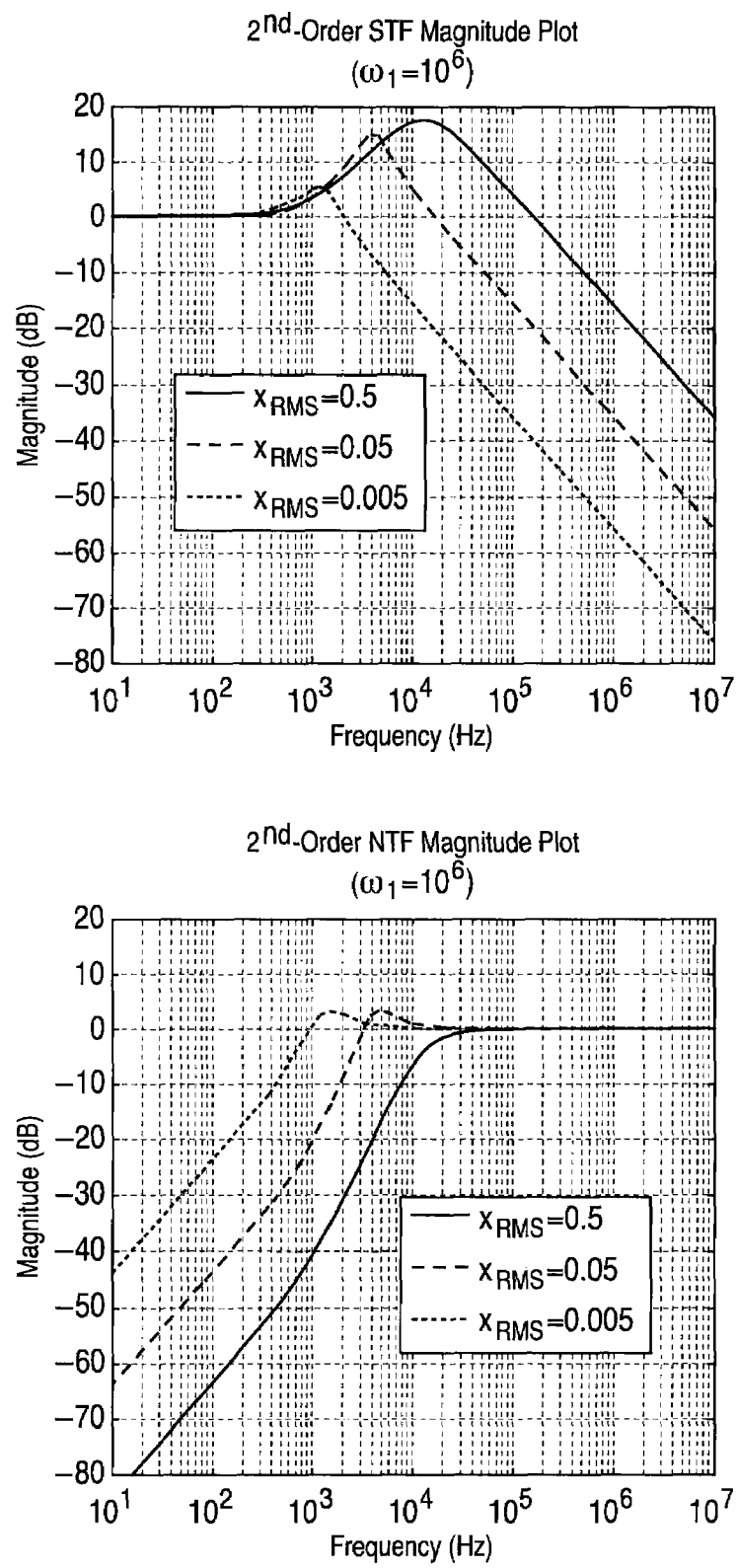
FIG. 17 illustrates small-signal STF and NTF frequency responses for a second-order ΣΔ difference-of-squares RMS-to-DC converter (for $\beta_x=\beta_y=1$, $\omega_1=10^6$) with a feedback zero-compensated filter.

The STF and NTF magnitude frequency responses are shown in FIG. 17. The STF peaking is not important for the ΣΔ RMS-to-digital converter operation, as all relevant information about the measured input RMS level is at DC. However, once again, the NTF low-frequency attenuation is a function of the input RMS level.

Figure 18:
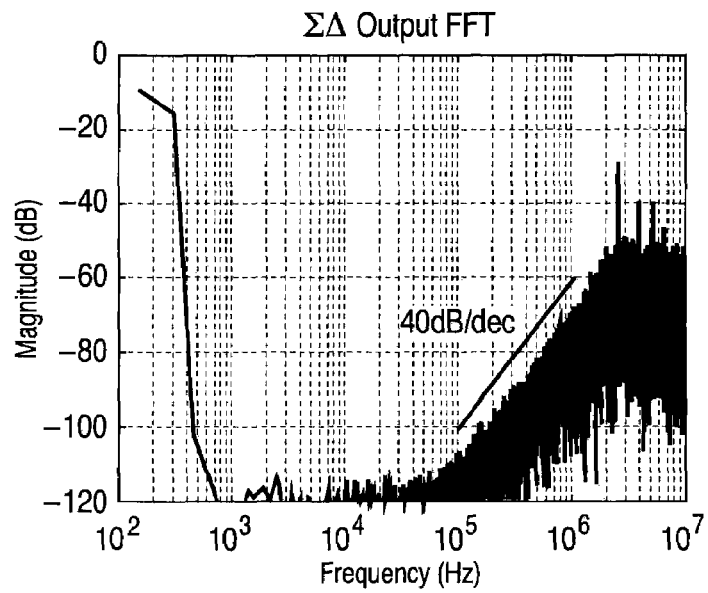
FIG. 18 illustrates an output spectrum of a second-order ΣΔ difference-of-squares RMS-to-DC converter employing one-bit internal quantization and feedback filtering, with sinusoidal RF input (for $f_{1N}=120$ MHz).

FIG. 18 shows the output spectrum of the second-order ΣΔ difference-of-squares RMS-to-DC converter employing single-bit internal quantization and filtering in the feedback path (FIGS. 14 and 14A). The 131072-points digital output was obtained from a transient circuit simulation with a sampling frequency ($f_S$) of 20 MHz and sinusoidal input x(t) =0.2*cos(2π*120 MHz*t). In this case, a second-order noise shaping (40 dB/dec slope) is obtained. Because of the filtering following the output of the single-bit DAC, the quantization noise PSD is quite small nearly $f_s/2$. In this case, the DC level in the single-bit digital output is proportional to the RMS level of the RF input signal minus the RMS level of the attenuated quantization noise. A high-resolution Nyquist-rate digital output can be obtained after the remaining high-frequency quantization noise is filtered-out.

Figure 19:
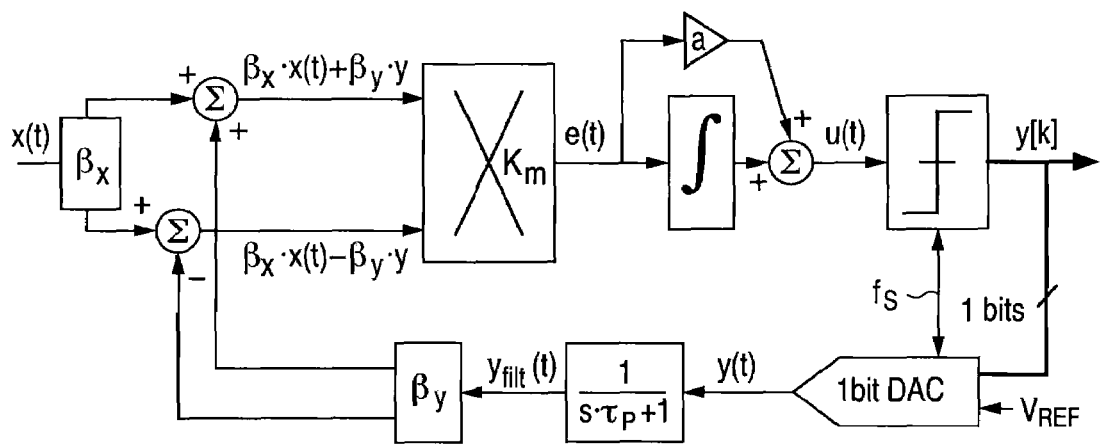
FIG. 19 illustrates a single-bit second-order ΣΔ difference-of-squares RMS-to-DC converter.
Figure 19A:
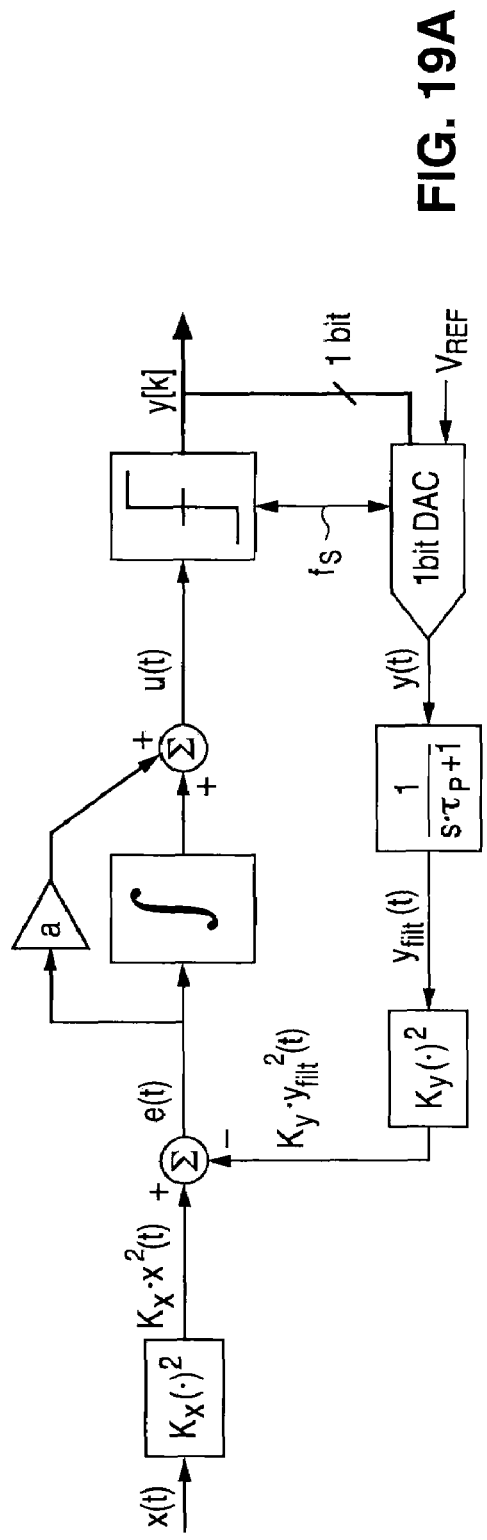
FIG. 19A illustrates a single-bit second-order ΣΔ difference-of-squares RMS-to-DC converter with two squaring cells employing feedback filtering and a feedforward path for high-frequency compensation.

Another way to achieve a stable second-order modulator with feedback filtering is illustrated in FIGS. 19 and 19A. A high-frequency compensation zero is implemented by the feedforward path with gain α placed across the integrator. In this architecture, the high-frequency quantization noise attenuation is higher than in the architectures shown in FIGS. 14 and 14A. This happens because attenuation with first-order roll-off can be maintained in the feedback path at high frequencies. In FIGS. 14 and 14A, the high-frequency attenuation is limited by the zero in the feedback path. As a result, the total quantization noise power $q^2_{RMS}$ is lower in the architectures shown in FIGS. 19 and 19A.

The feedback-path filtering technique can also be combined with a multi-bit ADC/DAC topology (as discussed above) in order to achieve further reduction of the total quantization noise power.

Figure 20:
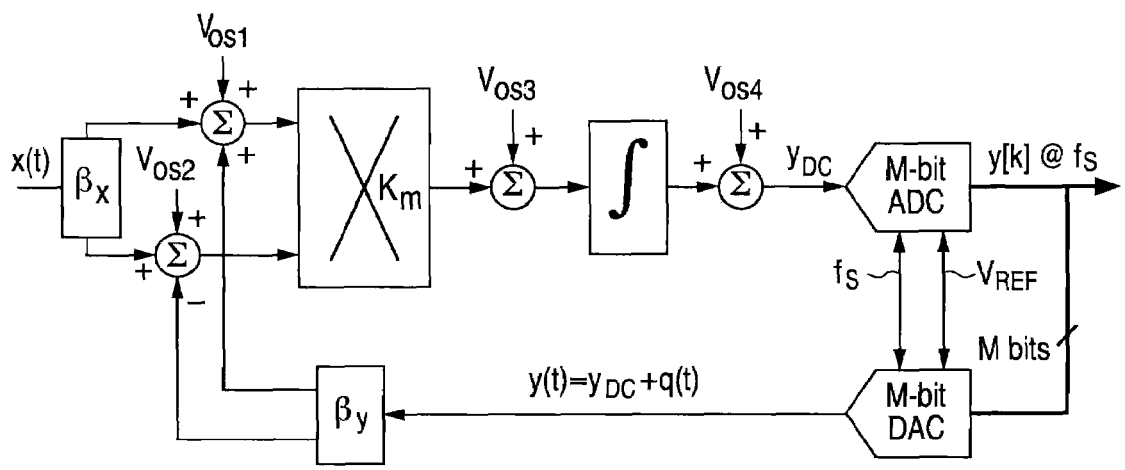
FIG. 20 illustrates a ΣΔ difference-of-squares RMS-to-DC converter and dominant offset sources.

Because all the information about the RMS level of the input appears as a DC component in the digital output of a ΣΔ RMS-to-DC converter, the major causes of measurement inaccuracies are the several sources of low-frequency errors present in any circuit implementation. FIG. 20 shows the block diagram of a ΣΔ RMS-to-DC converter where the error sources are modeled by the addition of four offset voltages $V_{os}$ at critical nodes.

The solution of the second degree equation relating the DC output component $y_{DC}$ and the several system inputs results in the steady-state transfer of the ΣΔ RMS-to-DC converter:

$$y_{DC} = \frac{-1}{2AK_m\beta_y^2} + \frac{V_{os2} - V_{os1}}{2\beta_y^2} \pm \sqrt{\left(\frac{1}{2AK_m\beta_y^2} + \frac{V_{os1} - V_{os2}}{2\beta_y^2}\right)^2 + \frac{V_{os4} + AV_{os3}}{AK_m\beta_y^2} + \frac{\beta_x^2 x(t)^2 - \beta_y^2 q(t)^2 + V_{os1}V_{os2}}{\beta_y^2}} \quad (17)$$

For large values of the integrator dc gain A, $y_{DC}$ becomes insensitive to offset added at the integrator output ($V_{os4}$):

$$\lim_{A\to\infty} y_{DC} = \frac{V_{os2} - V_{os1}}{2\beta_y^2} \pm \sqrt{\left(\frac{V_{os1} - V_{os2}}{2\beta_y^2}\right)^2 + \frac{V_{os3}}{K_m \beta_y^2} + \frac{\beta_x^2 \overline{x(t)^2} - \beta_y^2 \overline{q(t)^2} + V_{os1} V_{os2}}{\beta_y^2}} \quad (18)$$

Figure 21:
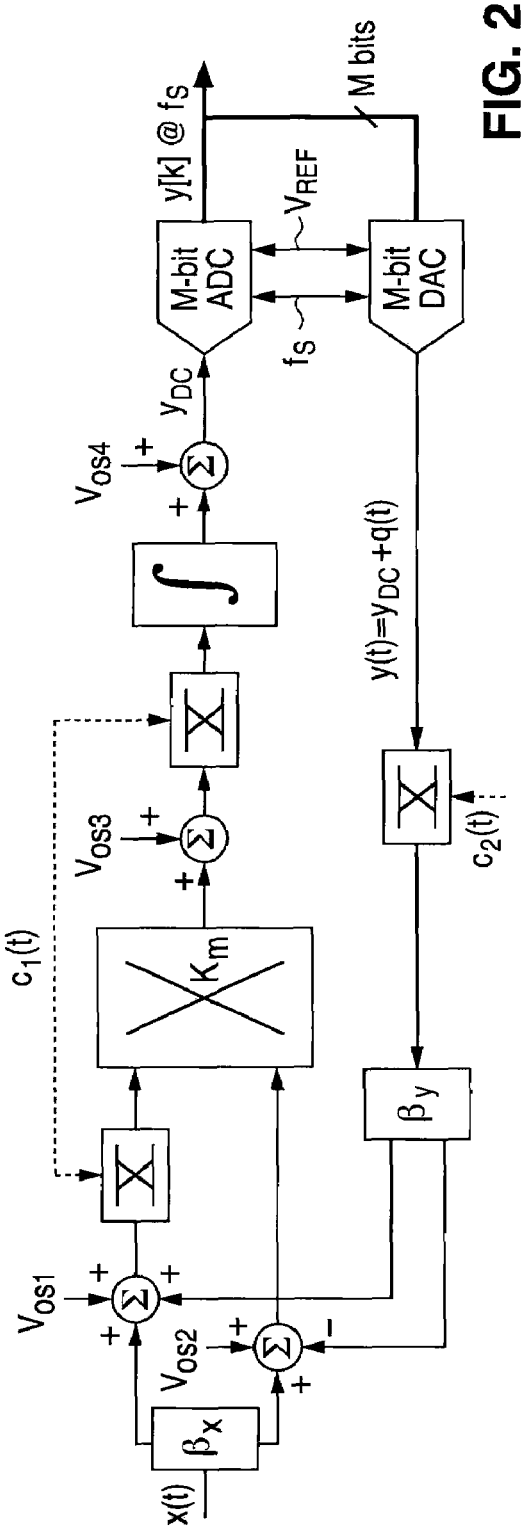
FIG. 21 illustrates a ΣΔ difference-of-squares RMS-to-DC converter employing choppers for offset reduction.

However, all other offset sources ($V_{os1}$ to $V_{os3}$) are present in the converter output and seriously impair the converter accuracy for low input power levels. The strategy to reduce the $\Sigma\Delta$ RMS-to-DC converter sensitivity to the remaining offset sources is to add choppers around the multiplier and in the feedback path, as depicted in FIG. 21. Chopper stabilization is a very effective technique to reduce the effect of offset errors in continuous-time circuits. It works by modulating the offset errors to frequencies far from DC, where the desired information (input RMS level in this case) is located.

The choppers, or commutators, effectively multiply the processed signal by the sequence +1, -1, +1, etc. . . . The choppers controlled by $c_1(t)$ remove the offset $V_{os3}$ from DC. The first commutator is placed in one of the mixer inputs, while the second one is placed at the mixer output. The concept of this approach is described in U.S. Pat. No. 7,197, 292 (the disclosure of which is incorporated herein by reference), and it is referred to as a "Chopper Stabilized Analog Multiplier". The chopper controlled by $c_2(t)$, placed in the feedback path, removes $V_{os1}$ and $V_{os2}$ from DC. The extension of the offset cancellation approach in RMS-to-DC converters to include a third chopper in the feedback path is described in commonly assigned U.S. patent application Ser. No. 11/498,450, entitled "Extended Range RMS-DC Converter" (the disclosure of which is incorporated herein by reference), and it is referred to as a "RMS-DC converter with dual chopper offset cancellation". The commutators' driving signals have the same following properties:

$$\overline{c_1(t)} = \overline{c_2(t)} = 0$$

$$c_1(t)^2 = c_2(t)^2 = C \quad (19)$$

where C represents an arbitrary constant different from zero. After being processed by the choppers, $V_{os3}$ is modulated to the frequency location $f_{c1}$, and $V_{os1} - V_{os2}$ is modulated to the frequency location $f_{c2}$. Therefore, the integrator bandwidth should be low enough to suppress the chopper frequencies $f_{c1}$ and $f_{c2}$. The relation between $x(t)$ and $y_{DC}$ for the architecture in FIG. 21 is given by:

$$y_{DC} = \frac{-1}{2AK_m\beta_y^2} \pm \sqrt{\left(\frac{1}{2AK_m\beta_y^2}\right)^2 + \frac{V_{os4}}{AK_m\beta_y^2} + \frac{\beta_x^2 \overline{x(t)^2} - \beta_y^2 \overline{q(t)^2} + V_{os1} V_{os2}}{\beta_y^2}} \quad (20)$$

When the DC-gain A approaches infinity and the conditions stated in (19) are met, this relation simplifies to:

$$\lim_{A\to\infty} y_{DC} = \pm \sqrt{\frac{\beta_x^2 \overline{x(t)^2} - \beta_y^2 \overline{q(t)^2} + V_{os1} V_{os2}}{\beta_y^2}} \quad (21)$$

Due to the three commutators added to the $\Sigma\Delta$ RMS-to-DC converter, the effects of the offsets $V_{os1}$, $V_{os2}$ and $V_{os3}$ in the converter output are completely eliminated. Only the second-order offset term $V_{os1} \cdot V_{os2}$ and the total power of the quantization error $\overline{q(t)^2}$ are left to limit the accuracy at lower input power levels. The effectiveness of this technique can be verified through circuit transient simulations of the block diagram shown in FIG. 21.

Figure 22:
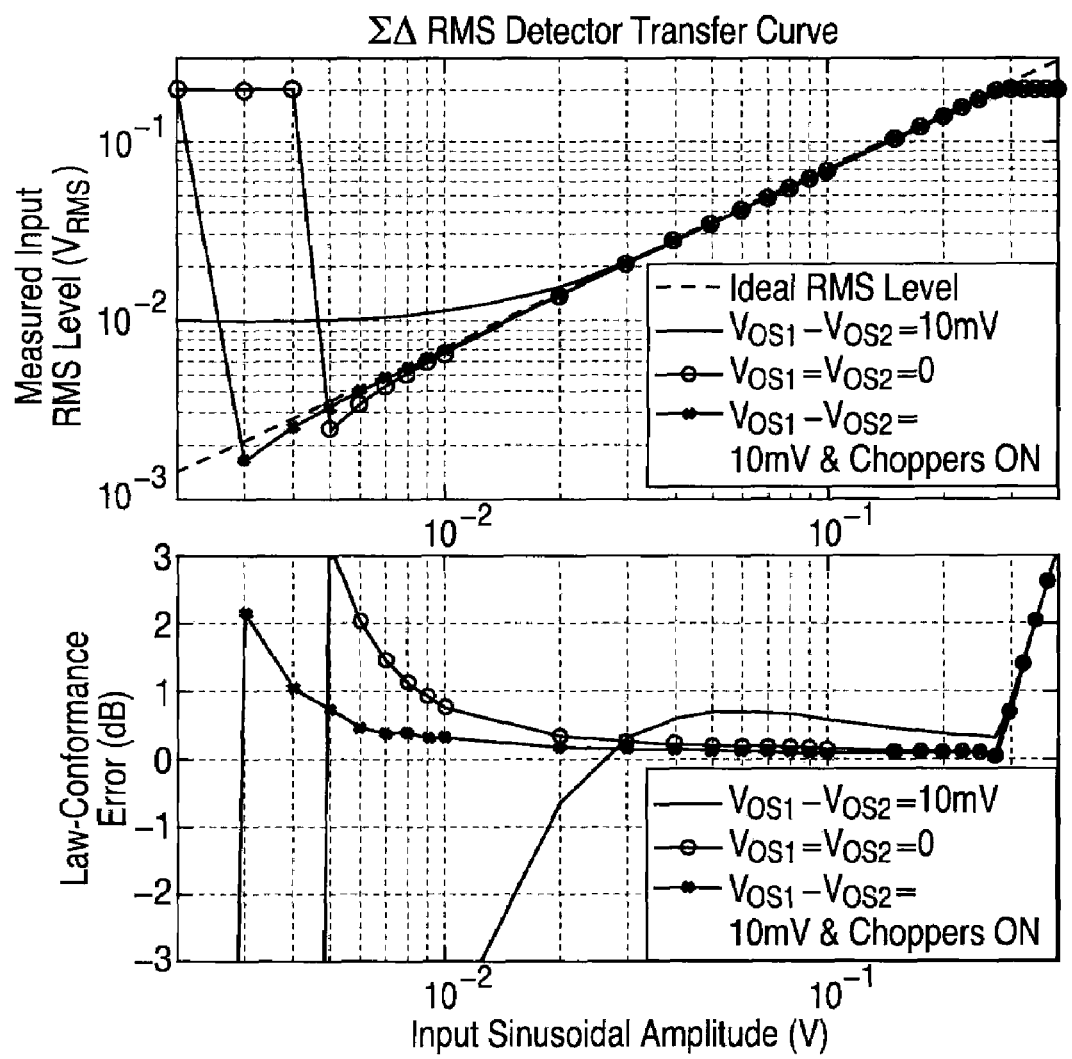
FIG. 22 illustrates a ΣΔ RMS-to-DC converter transfer characteristic and law-conformance error plot.

The top plot in FIG. 22 shows the simulated transfer characteristic of a $\Sigma\Delta$ RMS-to-DC converter in 3 different situations. The zero offset curve ($V_{OS1} = V_{OS2} = 0$) was obtained when all offset sources were nulled and the commutators were switched-off. The top-end of the output dynamic range is defined by the DAC reference voltage $V_{REF}$ that limits the maximum measurable RMS level. For input RMS levels beyond this limit, the $\Sigma\Delta$ RMS-to-DC converter output clips to $+V_{REF}$. The bottom-end of the dynamic range is defined by the quantization noise RMS level $q_{RMS}$. When $X_{RMS} < \beta_y / \beta_x \cdot q_{RMS}$, the $\Sigma\Delta$ RMS-to-DC converter output clips to $-V_{REF}$. The nonzero offset curve ($V_{OS1} - V_{OS2} = 10$ mV) was obtained when the offset voltages $V_{OS1} = 10$ mV and $V_{OS2} = 20$ mV were inserted, and the commutators were switched-off. In this case, the top-end of the dynamic range remains the same while the bottom-end of the dynamic range becomes offset limited. As predicted by (18), when $V_{OS3} = 0$ and $V_{OS2} - V_{OS1} \gg q_{RMS}$, the minimum measurable RMS level is $y_{DCmin} = (V_{OS2} - V_{OS1}) / \beta_y^2$. When the choppers controlled by the square waves $c_1(t)$ and $c_2(t)$ are turned on, all offset voltages are removed from DC. The $\Sigma\Delta$ RMS-to-DC converter transfer characteristic in this case is shown in the chopped offset curve ($V_{OS1} - V_{OS2} = 10$ mV and choppers on) and the residual offset is defined by the second order term $V_{OS2} \cdot V_{OS1}$. Because the polarity of product $V_{OS2} \cdot V_{OS1}$ in this simulation is opposite to the polarity of $q_{RMS}$, the clipping level achieved in the chopped offset curve is slightly smaller than that obtained in the zero offset curve. When the polarity of $V_{OS2} \cdot V_{OS1}$ is chosen to be the same as the polarity of $q_{RMS}$, the opposite result is obtained.

The bottom plot in FIG. 22 shows the law-conformance error for the $\Sigma\Delta$ RMS-to-DC converter for the same 3 situations: without offset sources (zero offset curve), with offset sources (nonzero offset curve), and with offset sources canceled by the choppers. The law-conformance error is defined as the division of the ideal input RMS level (black dashed curve) by the measured RMS level at the converter output. The useful input dynamic range can be defined as a function of the law-conformance error. For a law-conformance error bounded to ±1 dB, the input dynamic range is 30 dB when no offset sources are present, it reduces to 25 dB when $V_{OS2} - V_{OS1} = 10$ mV, and it becomes 37 dB when the choppers are turned on. Because the polarity of product $V_{OS2} \cdot V_{OS1}$ in this simulation is opposite to the polarity of $q_{RMS}$, the dynamic range achieved in the chopped offset curve is larger than the obtained in the zero offset curve.

Figure 23:
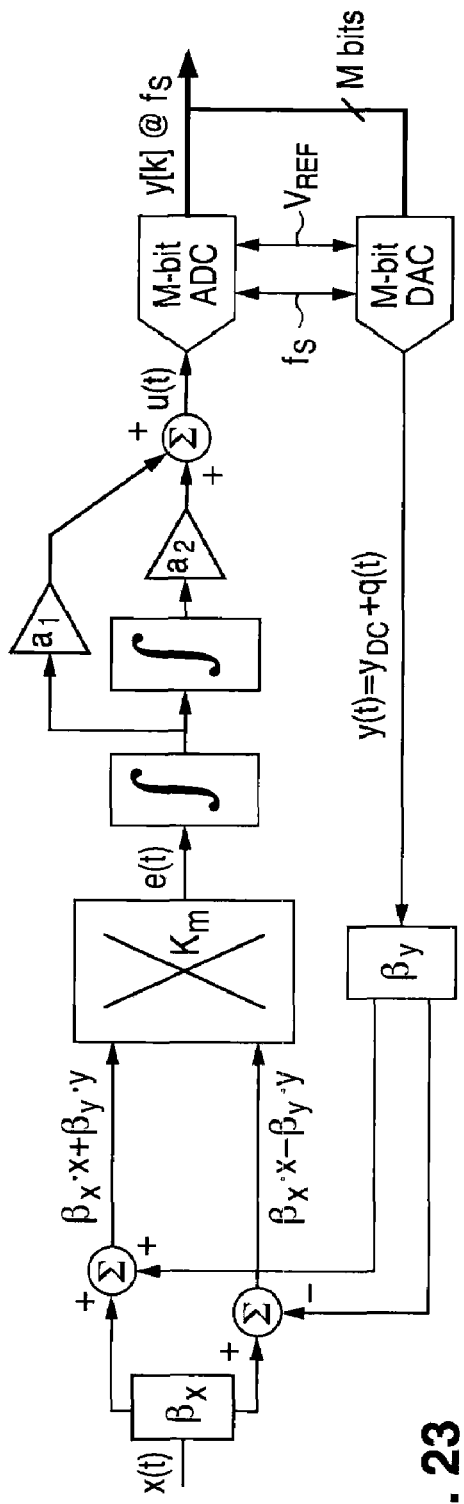
FIG. 23 illustrates a second-order ΣΔ difference-of-squares RMS-to-DC converter with forward path multiplier.
Figure 23A:
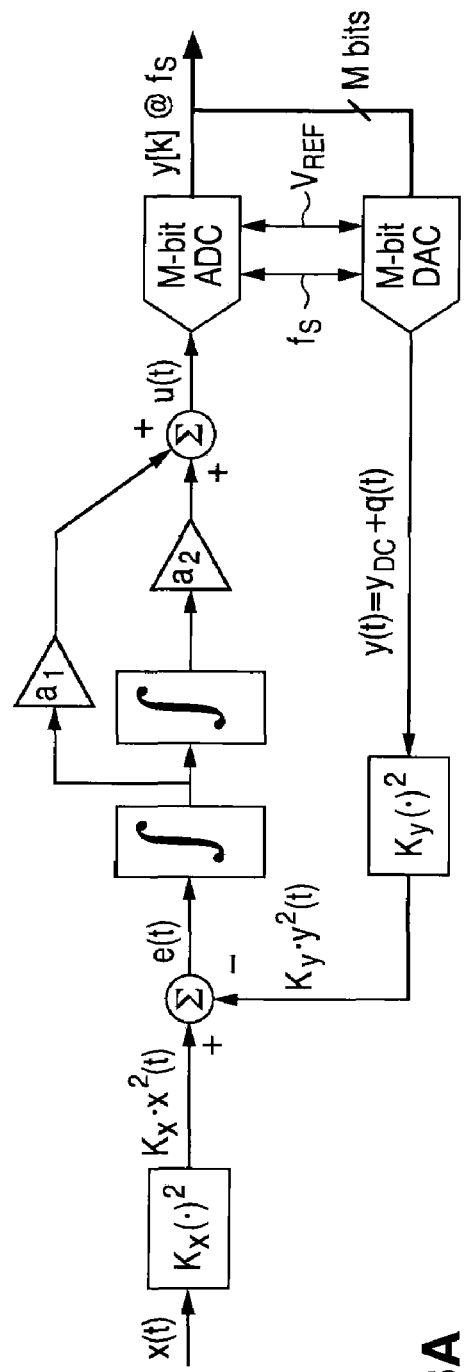
FIG. 23A illustrates a second-order ΣΔ difference-of-squares RMS-to-DC converter with two squaring cells.

The quantization noise attenuation at low-frequencies can be increased in $\Sigma\Delta$ RMS-to-DC converters if the loop filter order is increased. FIGS. 13, 13A, 14, 14A, 19 and 19A show examples of second-order modulators implemented with a single integrator in the feedforward path and a pole in the feedback path. A second-order modulator can also be implemented if two integrators are employed in the feedforward path, as depicted in FIGS. 23 and 23A. In order to achieve a stable modulator, the $\alpha_1$ feedforward coefficients are designed to implement high-frequency zeros in the loop filer transfer function.

Figure 24:
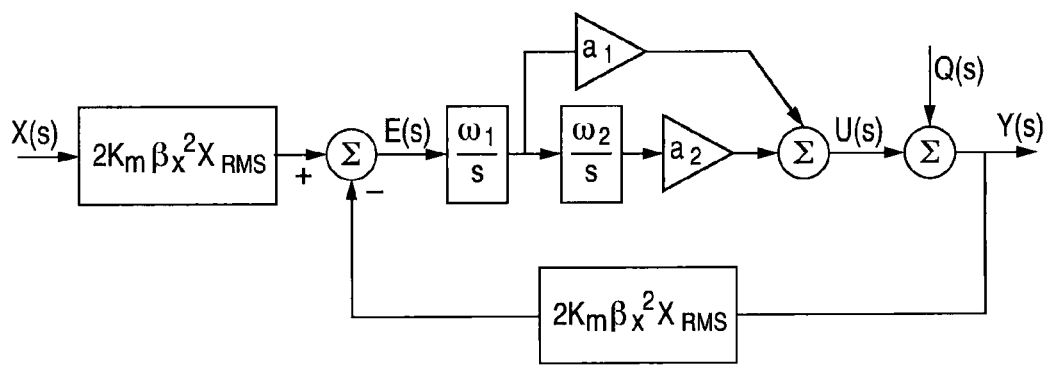
FIG. 24 illustrates a linearized small-signal model for the second-order ΣΔ difference-of-squares RMS-to-DC converter shown in FIG. 23.

For every input RMS level $X_{RMS}$, after all internal voltages have reached a steady-situation, linearized small-signal models (FIGS. 24 and 24A) of the second-order architectures above described can be derived:

A small-signal loop filter transfer function can be derived based on FIG. 24:

$$L(s) = \frac{2K_m\beta_x^2 X_{RMS}(s \cdot a_1\omega_1 + a_2\omega_2\omega_1)}{s^2} \quad (22)$$

Figure 24A:
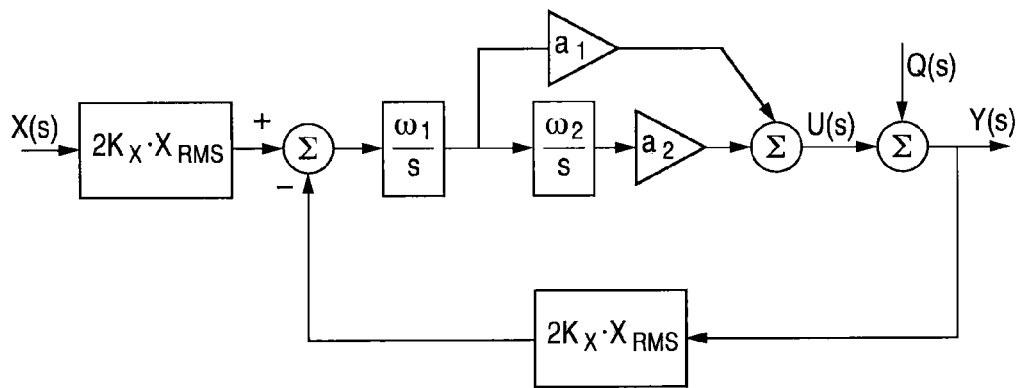
FIG. 24A illustrates a linearized small-signal model for the second-order ΣΔ difference-of-squares RMS-to-DC converter shown in FIG. 23A.

Based on FIG. 24A, the small-signal loop filter transfer function becomes:

$$L(s) = \frac{2K_x X_{RMS}(s \cdot a_1\omega_1 + a_2\omega_2\omega_1)}{s^2} \quad (22A)$$

Figure 25:
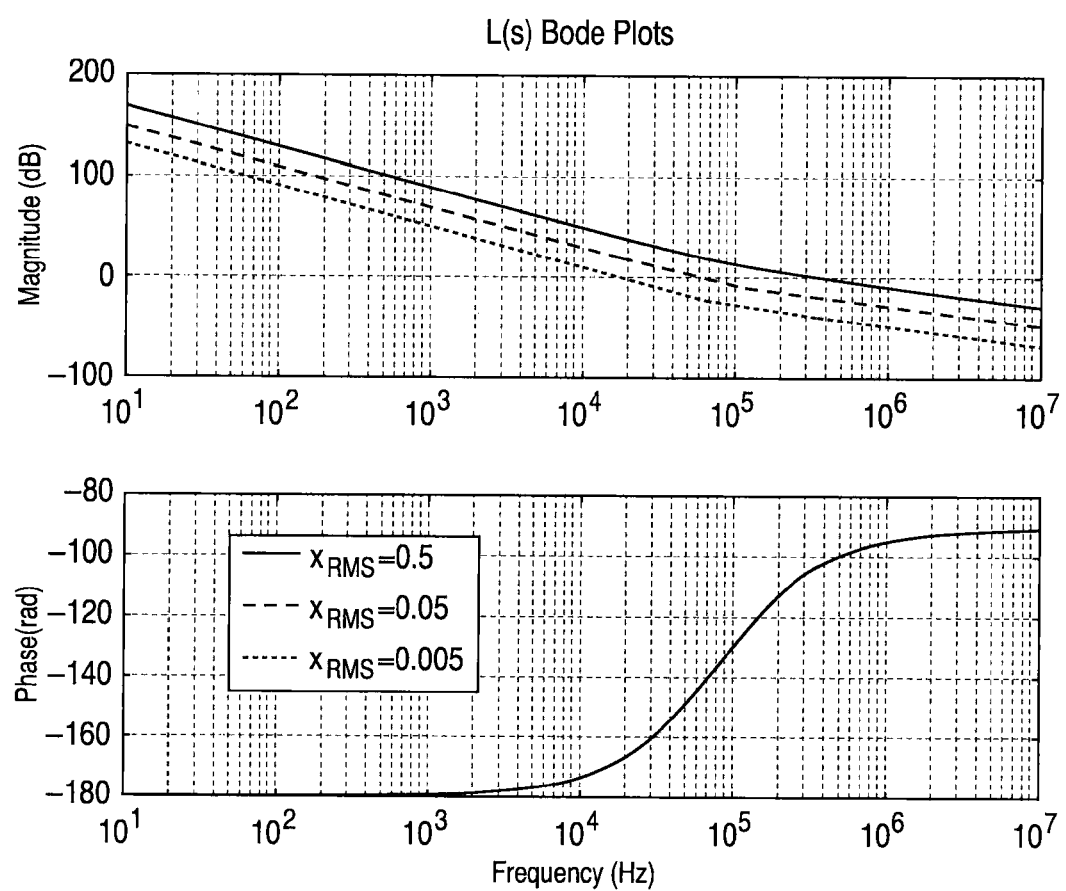
FIG. 25 illustrates Bode plots for the small-signal second-order loop filter (for $K_m=\beta_x=\beta_y=1$, $\omega_1=\omega_2=10^6$, $\alpha_1=2$ and $\alpha_2=1$).

The feedforward coefficient $\alpha_1$ implements a high-frequency compensation zero in the loop filter transfer function, while at low frequencies a second-order noise shape is achieved. FIG. 25 shows the loop filter Bode plots. The second-order $\Sigma\Delta$ RMS-to-DC converter is stable for all sampling frequencies for which the loop filter phase-delay approaches −90 deg at $f_S/2$.

For the linearized model in FIG. 24, the small-signal STF and NTF can be calculated as well:

$$STF = \frac{2K_m\beta_x^2 X_{RMS}(s \cdot a_1\omega_1 + a_2\omega_2\omega_1)}{s^2 + 2K_m\beta_x^2 X_{RMS}(s \cdot a_1\omega_1 + a_2\omega_2\omega_1)} \quad (23)$$

$$NTF = \frac{s^2}{s^2 + 2K_m\beta_x^2 X_{RMS}(s \cdot a_1\omega_1 + a_2\omega_2\omega_1)} \quad (24)$$

Figure 26:
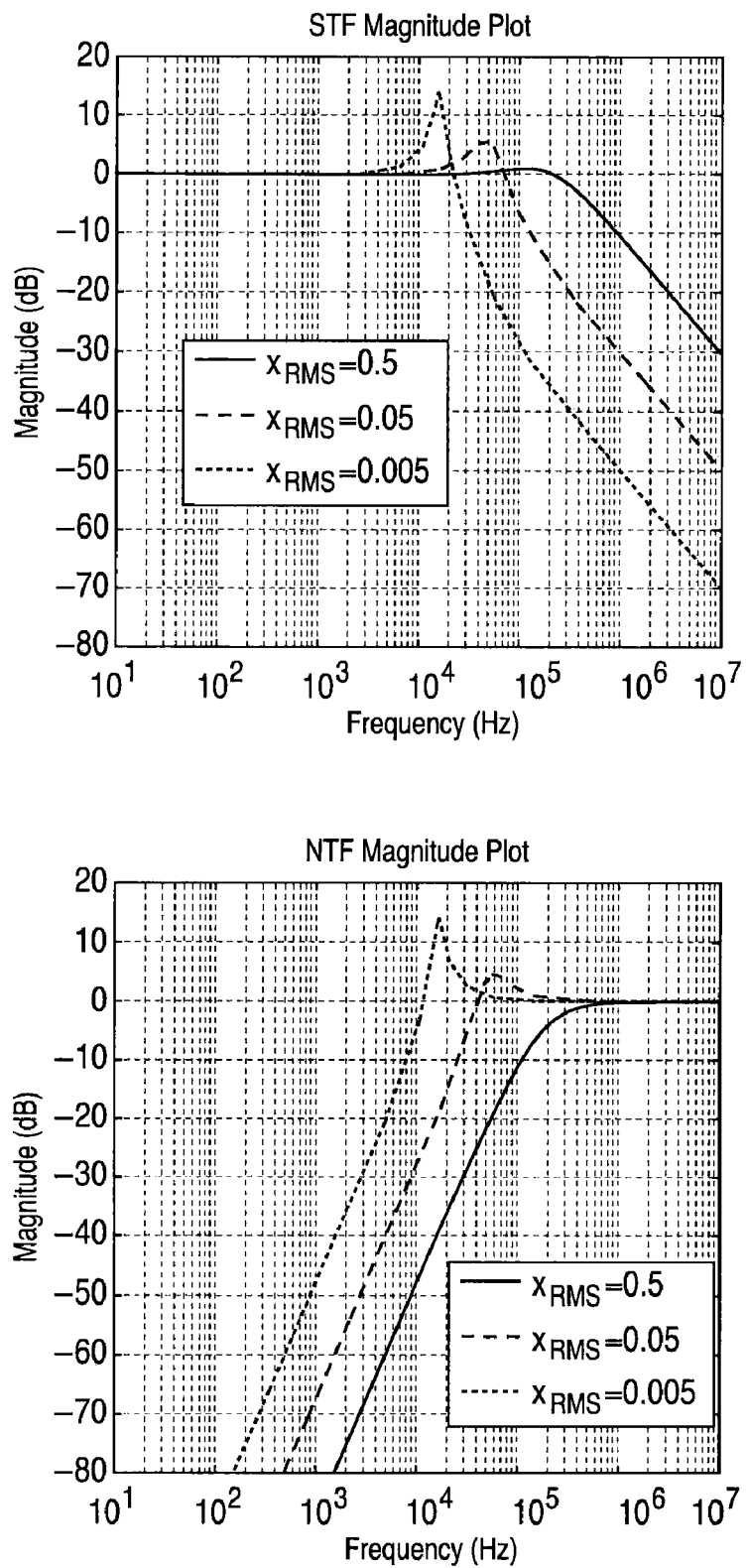
FIG. 26 illustrates small-signal STF and NTF frequency responses for the second-order ΣΔ difference-of-squares RMS-to-DC converter (for $K_m=\beta_x=\beta_y=1$, $\omega_1=\omega_2=10^6$, $a_1=2$ and $a_2=1$).

The STF and NTF magnitude frequency responses are shown in FIG. 26. Once again, the STF peaking is not important, and the NTF low-frequency attenuation is a function of the input RMS level.

The methodology to implement stable loop filters using feedforward compensation can be used to design $\Sigma\Delta$ RMS-to-DC converters of higher orders (3 or more integrators). Other compensation techniques originally developed for conventional $\Sigma\Delta$ modulators, based on feedback and/or local feedforward coefficients, can be employed as well.

Figure 27:
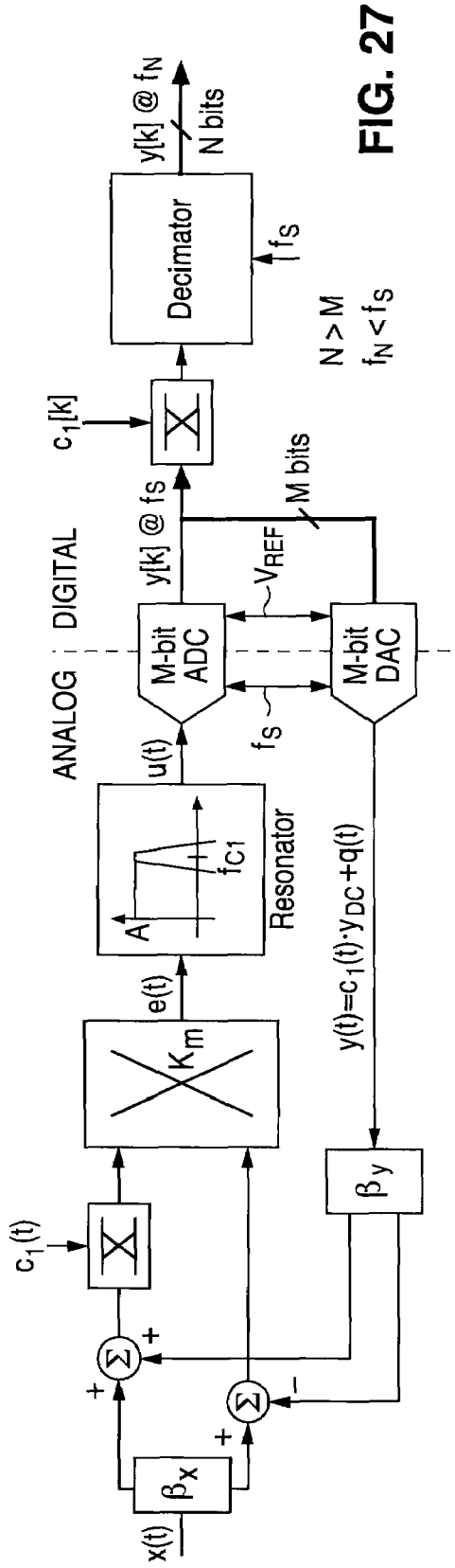
FIG. 27 illustrates a bandpass ΣΔ difference-of-squares RMS-to-DC converter and digital decimator.

The sensitivity of a $\Sigma\Delta$ RMS-to-DC converter to low-frequency errors is minimized when the modulator is built around a bandpass loop filter. FIG. 27 describes the complete bandpass $\Sigma\Delta$ RMS-to-digital converter. This architecture employs an analog chopper, placed before one of the multiplier inputs, and a digital chopper, placed at the digital decimator input. The analog chopper, driven by the square wave $c_1(t)$, modulates the difference-of-squares $e(t)=c_1(t)\cdot[\beta_x^2 x(t)^2 - \beta_y^2 y(t)^2]$ to the resonator center frequency $f_{c1}$. Because the resonator gain is very high at this frequency, the amplitude of $e(t)$ is driven to zero in a steady-state situation. At the same time, all frequency components outside the resonator narrow bandwidth are suppressed. In this architecture, the signal amplitude at the frequency component $f_{c1}$ is proportional to the input RMS level. In order to obtain a RMS-to-digital converter with a low-frequency Nyquist-rate output, the measured RMS level is down-converted to DC by the digital chopper before the modulator output is processed by the digital decimator.

Figure 28:
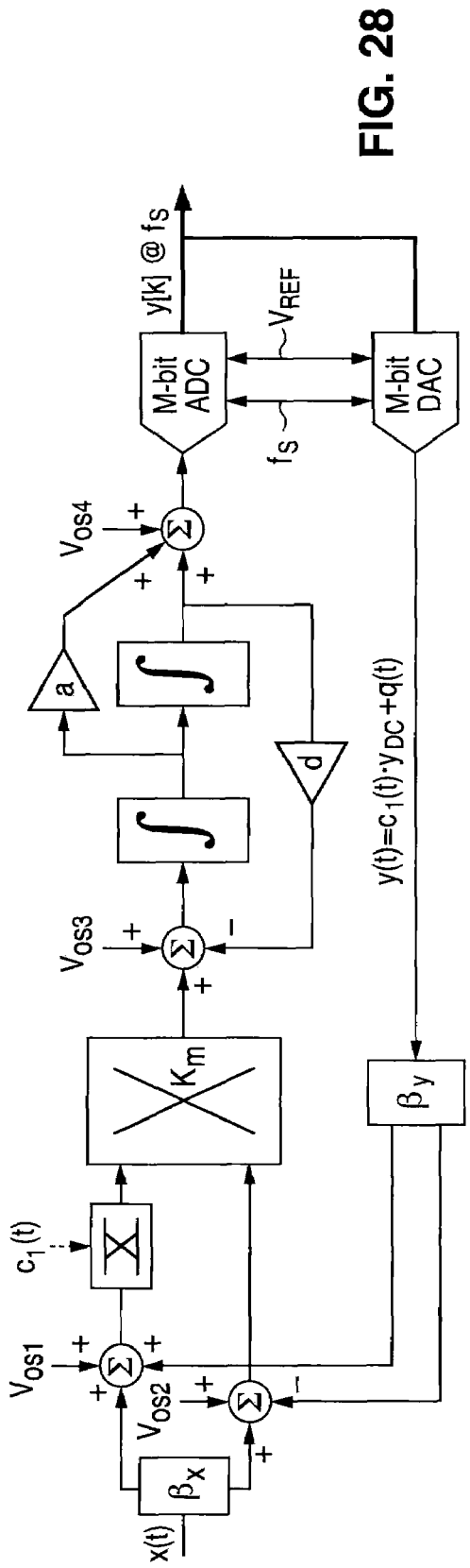
FIG. 28 illustrates a bandpass ΣΔ difference-of-squares RMS-to-DC converter and dominant offset sources.

The block diagram depicted in FIG. 28 shows the bandpass $\Sigma\Delta$ RMS-to-DC converter and the dominant sources of low-frequency errors, modeled by the addition of four offset voltage $V_{os}$ at critical nodes. The resonator, comprising two integrators and a local feedback path with gain d, is shown in more details. As in the case of regular bandpass $\Sigma\Delta$ modulators, the resonator center frequency $f_{c1}$ is a rational fraction of $f_S$.

In the case of a bandpass $\Sigma\Delta$ RMS-to-DC converter, the chopper frequency is always equal to bandpass loop filter center frequency. Because the loop filter contains two integrators, feedforward compensation is needed to implement a high-frequency zero and keep the modulator stable. The block diagrams shown in FIGS. 27 and 28 describe bandpass $\Sigma\Delta$ RMS-to-DC converters built with internal multi-bit quantization. As in the case of the lowpass architectures discussed above, single-bit quantization can be employed as well if the feedback bitstream is filtered before the multiplier input.

The input of the loop filter resonator in a steady-state situation can be calculated based on the analysis of FIG. 28:

$$V_{os3} + K_m \quad (25)$$

$$\left\{ \begin{array}{c} c_1[\beta_x^2 x(t)^2 + V_{os1}V_{os2} - \beta_y^2(y_{DC}^2 + q(t)^2)] + c_1\beta_x x(t)(V_{os1} + V_{os2}) + \\ c_1\beta_y q(t)(V_{os2} - V_{os1}) + \beta_y y_{DC}(V_{os2} - V_{os1}) - 2\beta_y^2 y_{DC} q(t) \end{array} \right\}$$

In expression (25), only the terms between the square brackets contribute to the amplitude of the signal at frequency $f_{c1}$. At the resonator output, all frequency components outside the resonator narrow bandwidth are suppressed. The quantizer input is then given by:

$$u(t) = V_{os4} + c_1 \cdot AK_m \left\{ \begin{array}{c} \beta_x^2 \overline{x(t)^2} + V_{os1}V_{os2} - \beta_y^2(y_{DC}^2 + \overline{q(t)^2} + \\ \beta_x \overline{x(t)}(V_{os1} + V_{os2}) + \beta_y \overline{q(t)}(V_{os2} - V_{os1}) \end{array} \right\} \quad (26)$$

Taking in account that the offset $V_{os4}$ does not have any contribution to the loop filter output at the frequency $f_{c1}$, the relation between x(t) and $y_{DC}$ can be calculated:

$$y_{DC} = \frac{-1}{2AK_m\beta_y^2} \pm \sqrt{\left(\frac{1}{2AK_m\beta_y^2}\right)^2 + \frac{\beta_x^2 \overline{x(t)^2} - \beta_y^2 \overline{q(t)^2} + V_{os1}V_{os2}}{\beta_y^2}} \quad (27)$$

When the resonator center-frequency gain A approaches infinity, this relation simplifies to:

$$\lim_{A\to\infty} y_{DC} = \pm\sqrt{\frac{\beta_x^2 \overline{x(t)^2} - \beta_y^2 \overline{q(t)^2} + V_{os1}V_{os2}}{\beta_y^2}} \quad (28)$$

The result achieved in (28), obtained by means of a chopper stabilized bandpass $\Sigma\Delta$ RMS-to-DC converter, is the same achieved in (21), obtained by means of a chopper stabilized lowpass ΣΔ RMS-to-DC converter. However, the bandpass solution as discussed herein present several advantages including:

1. Only one chopper is required in the analog domain, what reduces the charge injection errors to a minimum;

2. Final down-conversion to DC is performed in the digital domain, almost without non-idealities; and 3. Loop filter integrators do not need to be chopped because all DC error sources added after the multiplier are irrelevant to the accuracy of the RMS measurement.

In ideal ΣΔ difference-of-squares RMS-to-DC converters, where no sources of DC errors are present, the input-referred dynamic range is determined by the resolution of the internal quantization. The maximum measured RMS level equals the DAC reference voltage ($V_{REF}$). The minimum measurable voltage is determined by the RMS level $q_{RMS}$ of the quantization errors. As defined in (1), $q_{RMS}$ is a function of $V_{REF}$ and the number of bits of the internal quantizer. Effectively, $q_{RMS}$ can also be reduced if filtering is employed in the feedback path of the ΣΔ RMS-to-DC converter. When $\beta_x^2 X_{RMS}^2 < \beta_y^2 q_{RMS}^2$, the converter output clips to $-V_{REF}$. These dynamic range limits can be perceived in FIG. 22.

Figure 29:
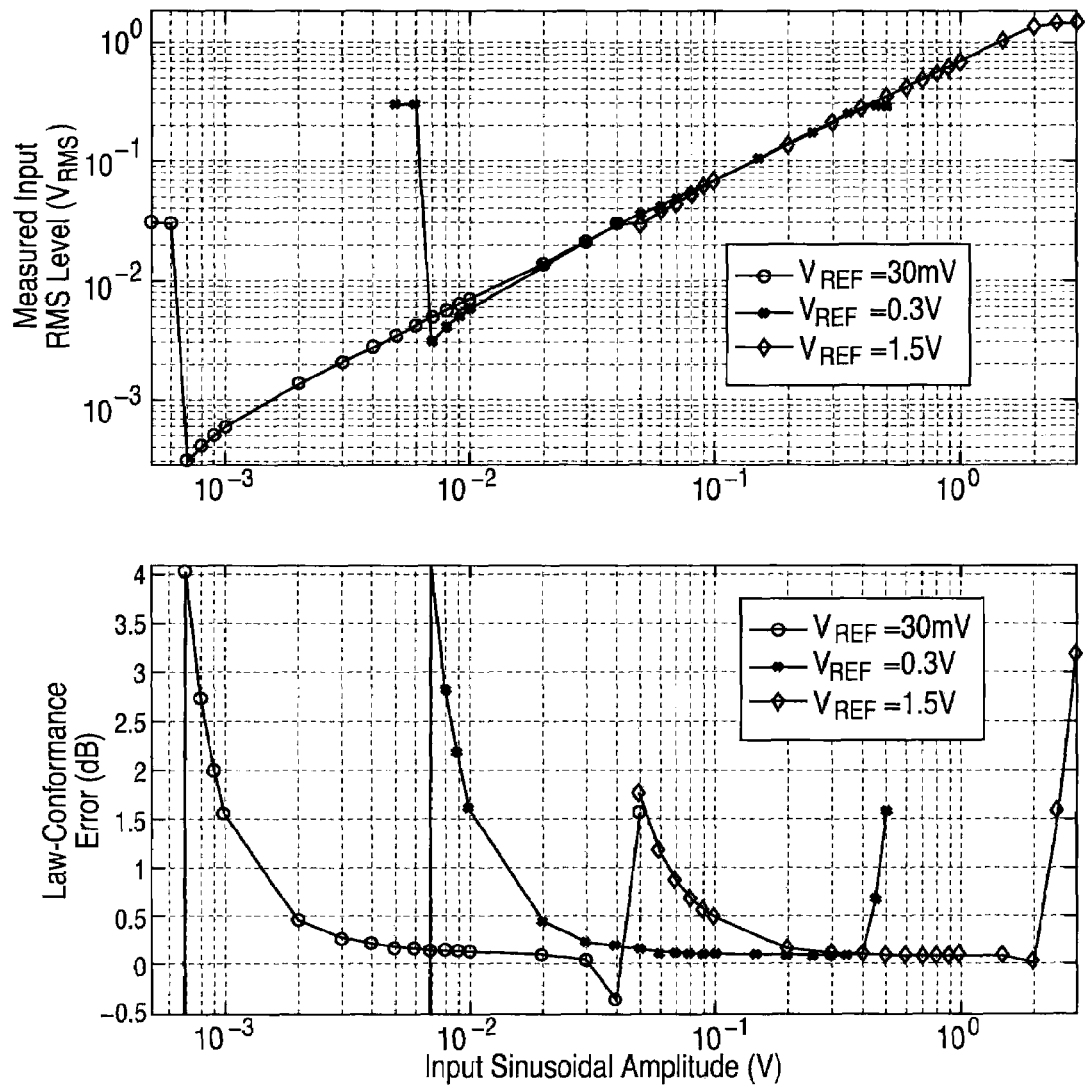
FIG. 29 illustrates an extended input-referred dynamic range due to the implicit DAC variable gain function.

However, the position of the dynamic range (DR) relative to the range of possible input levels is only determined by the feedback DAC reference voltage. Therefore, the total input-referred dynamic range can be extended by controlling $V_{REF}$ properly. This possibility is illustrated in FIG. 29 for transient simulations performed with 3 different values of $V_{REF}$. The top plot in FIG. 29 shows the ΣΔ RMS-to-DC converter transfer curves, while the bottom plot shows the law-conformance error. For every value of $V_{REF}$, the RMS detector output dynamic range complies with the limits described in the first paragraph. When the information about $V_{REF}$ is encoded in the final Nyquist-rate output of the complete ΣΔ RMS-to-digital converter, the total input-referred DR becomes the piece-wise addition of the individual dynamic ranges obtained with every setting of $V_{REF}$. According to FIG. 29, for a law-conformance error bounded to ±0.5 dB, the total input-referred DR is 60 dB.

If the ΣΔ RMS-to-DC converter reference voltage $V_{REF}$ is controlled based on the output bitstream or the measured RMS level, then an automatic gain control (AGC) function is implemented. For example, $V_{REF}$ can be automatically increased when a long sequence of 1's is detected in the digital output, or decreased in the case a long sequence of 0's is detected. If the relation among the different values used for $V_{REF}$ is linear, then a linear digital-output RMS detector is implemented. If the relation among the different values used for $V_{REF}$ is exponential, then a Logarithmic digital-output RMS detector is implemented.

In practice however, the DR extension obtained with the feedback DAC intrinsic variable-gain function is limited by circuit non-idealities such as thermal noise and the DR limitations of other internal analog blocks. For every $V_{REF}$ setting, the DR of the multiplier has to be adjusted to the magnitude levels of the internal voltages and currents. The residual offset also limits the ΣΔ RMS-to-DC converter accuracy in the bottom-end of the extended DR, where small values of $V_{REF}$ are employed.

The preferred embodiments for the chopper stabilized ΣΔ difference-of-squares RMS-to-DC converter are shown in FIGS. 7, 14, 19, 21 and 28. However, the concepts presented in this invention disclosure are thought to be independent of the precise electronic implementation.

Accordingly, based upon the foregoing discussion, a ΣΔ difference-of-squares RMS-to-digital converter provides numerous advantages, including:

1. A ΣΔ difference-of-squares RMS-to-digital converter employing internal multi-bit quantization, implemented with a multiplier (FIG. 7) or with matched squaring circuits (FIG. 8);

2. A ΣΔ difference-of-squares RMS-to-digital converter with an $N^{th}$-order loop filter employing single-bit quantization and filtering in the feedback path, as described in FIGS. 13, 14 and 19, including the addition of a loop filter zero for frequency compensation;

3. A chopper-stabilized ΣΔ difference-of-squares RMS-to-digital converter with extended dynamic range, according to 1) and 2) employing commutators around the multiplier and in the feedback path as described in FIG. 21;

4. A ΣΔ difference-of-squares RMS-to-digital converter according to 1), 2) and 3) built around a loop filter with more than 1 integrator, stabilized by feedforward and/or feedback paths, as exemplified in FIG. 23;

5. A chopper-stabilized bandpass ΣΔ difference-of-squares RMS-to-digital converter, according to 1) and 2), and described in FIGS. 27 and 28;

6. A ΣΔ difference-of-squares RMS-to-digital converter according to FIGS. 7, 8, 14, 19, 21, 23 or 28 in which the feedback DAC reference voltage $V_{REF}$ is dynamically adjustable, preferably but not necessarily as a function of the converter output signal; and 7. A ΣΔ difference-of-squares RMS-to-DC converter according to 1), 2), 3), 4), 5) and 6) that is operated as a single-shot ΣΔ modulator with optimized digital decimation filter, i.e., as an incremental ΣΔ difference-of-squares RMS-to-digital converter.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a sigma-delta difference-of-squares RMS-to-DC converter, comprising:

analog signal multiplication and combining circuitry responsive to an analog input signal and at least one analog feedback signal by providing a resultant analog signal including at least one signal component corresponding to a difference between a square of said analog input signal and a square of said analog feedback signal;

analog signal filter circuitry coupled to said analog signal multiplication and combining circuitry, and responsive to said resultant analog signal by providing a filtered analog signal;

analog-to-digital conversion (ADC) circuitry coupled to said analog signal filter circuitry and responsive to said filtered analog signal by providing a related digital output signal; and digital-to-analog conversion (DAC) circuitry coupled between said ADC circuitry and said analog signal multiplication and combining circuitry, and responsive to said digital output signal by providing said at least one analog feedback signal.

2. The apparatus of claim 1, wherein said analog signal multiplication and combining circuitry comprises:

first analog signal multiplication circuitry responsive to said analog input signal by providing a first analog product signal;

second analog signal multiplication circuitry responsive to said at least one analog feedback signal by providing a second analog product signal; and analog signal combining circuitry coupled to said first and second analog signal multiplication circuitries, and responsive to said first and second analog product signals by providing said resultant analog signal.

3. The apparatus of claim 1, wherein:

said ADC circuitry comprises a single-bit quantizer; and said DAC circuitry comprises a single-bit DAC circuit.

4. The apparatus of claim 3, further comprising feedback lowpass filter circuitry coupled between said DAC circuitry and said analog signal multiplication and combining circuitry, and responsive to said at least one analog feedback signal by providing said at least one analog feedback signal as at least one filtered signal.

5. The apparatus of claim 4, wherein said analog signal filter circuitry comprises:

filter circuitry coupled to said analog signal multiplication and combining circuitry, and responsive to said resultant analog signal by providing a first intermediate signal;

amplifier circuitry coupled to said analog signal multiplication and combining circuitry, and responsive to said resultant analog signal by providing a second intermediate signal; and analog signal combining circuitry coupled to said filter circuitry and said amplifier circuitry, and responsive to said first and second intermediate signals by providing said filtered analog signal.

6. The apparatus of claim 3, further comprising feedback bandpass filter circuitry coupled between said DAC circuitry and said analog signal multiplication and combining circuitry, and responsive to said at least one analog feedback signal by providing said at least one analog feedback signal as at least one filtered signal.

7. The apparatus of claim 1, wherein said analog signal filter circuitry comprises:

first filter circuitry coupled to said analog signal multiplication circuitry and responsive to said analog product signal by providing a first intermediate signal;

second filter circuitry coupled to said first filter circuitry and responsive to said first intermediate signal by providing a second intermediate signal;

amplifier circuitry coupled to said first filter circuitry and responsive to said first intermediate signal by providing a third intermediate signal; and second analog signal combining circuitry coupled to said second filter circuitry and said amplifier circuitry, and responsive to said second and third intermediate signals by providing said filtered analog signal.

8. An apparatus including a sigma-delta difference-of-squares RMS-to-DC converter, comprising:

analog signal multiplier and combiner means for multiplying and combining an analog input signal and at least one analog feedback signal to provide a resultant analog signal including at least one signal component corresponding to a difference between a square of said analog input signal and a square of said analog feedback signal;

analog signal filter means for filtering said resultant analog signal to provide a filtered analog signal;

analog-to-digital converter (ADC) means for converting said filtered analog signal to a related digital output signal; and digital-to-analog converter (DAC) means for converting said digital output signal to said at least one analog feedback signal.

9. A method for performing a sigma-delta difference-of-squares RMS-to-DC conversion, comprising:

multiplying and combining an analog input signal and at least one analog feedback signal to provide a resultant analog signal including at least one signal component corresponding to a difference between a square of said analog input signal and a square of said analog feedback signal;

filtering said resultant analog signal to provide a filtered analog signal;

converting said filtered analog signal to a related digital output signal; and converting said digital output signal to said at least one analog feedback signal.

* * * * *